(12) United States Patent
Lehtola

(10) Patent No.: US 10,804,866 B2
(45) Date of Patent: Oct. 13, 2020

(54) DOHERTY AMPLIFIER HAVING ENVELOPE CONTROL

(71) Applicant: SKYWORKS SOLUTIONS, INC., Woburn, MA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/188,880

(22) Filed: Nov. 13, 2018

(65) Prior Publication Data

US 2019/0149099 A1 May 16, 2019

Related U.S. Application Data

(60) Provisional application No. 62/585,503, filed on Nov. 13, 2017, provisional application No. 62/585,502, filed on Nov. 13, 2017.

(51) Int. Cl.
| | |
|---|---|
| *H03F 1/02* | (2006.01) |
| *H03F 3/60* | (2006.01) |
| *H03F 3/21* | (2006.01) |
| *H03F 3/24* | (2006.01) |

(52) U.S. Cl.
CPC .......... *H03F 3/602* (2013.01); *H03F 1/0266* (2013.01); *H03F 1/0288* (2013.01); *H03F 3/24* (2013.01); *H03F 2200/102* (2013.01); *H03F 2200/336* (2013.01)

(58) Field of Classification Search
USPC .................. 330/295, 124 R, 84, 286, 53–54
See application file for complete search history.

(56) References Cited

U.S. PATENT DOCUMENTS

| | | | |
|---|---|---|---|
| 8,183,929 B2 * | 5/2012 | Grondahl | H03F 1/0261 330/124 R |
| 9,219,445 B2 * | 12/2015 | Nobbe | H03F 1/0227 |
| 9,742,365 B1 * | 8/2017 | Ozard | H03F 3/211 |

* cited by examiner

*Primary Examiner* — Hieu P Nguyen
(74) *Attorney, Agent, or Firm* — Chang & Hale LLP

(57) ABSTRACT

Doherty amplifier having envelope control. In some embodiments, an amplifier system can include a Doherty amplifier having a carrier amplifier and a peaking amplifier, with each of the carrier amplifier and the peaking amplifier including a cascode stage with input and output transistors arranged in a cascode configuration. The amplifier system can further include an envelope tracking bias circuit coupled to the Doherty amplifier and configured to provide a bias signal to the output transistor of the cascode stage of the peaking amplifier.

20 Claims, 28 Drawing Sheets

DOHERTY AMPLIFIER HAVING ENVELOPE CONTROL

CROSS-REFERENCE TO RELATED APPLICATION(S)

This application claims priority to U.S. Provisional Application Nos. 62/585,502 filed Nov. 13, 2017, entitled DOHERTY POWER AMPLIFIER HAVING ENVELOPE CONTROL, and 62/585,503 filed Nov. 13, 2017, entitled QUADRATURE AMPLIFIER HAVING ENVELOPE CONTROL, the disclosure of each of which is hereby expressly incorporated by reference herein in its entirety.

BACKGROUND

Field

The present disclosure relates to envelope control for radio-frequency (RF) amplifiers.

Description of the Related Art

In radio-frequency (RF) applications, envelope tracking technique can be implemented, where a supply voltage being provided to an amplifier is adjusted based on an envelope of the signal being amplified. Such a technique can provide, for example, improved efficiency for different power associated with the signal.

SUMMARY

According to some implementations, the present disclosure relates to an amplifier system that includes a Doherty amplifier having a carrier amplifier and a peaking amplifier. Each of the carrier amplifier and the peaking amplifier includes a cascode stage with input and output transistors arranged in a cascode configuration. The amplifier system further includes an envelope tracking bias circuit coupled to the Doherty amplifier and configured to provide a bias signal to the output transistor of the cascode stage of the peaking amplifier.

In some embodiments, the Doherty amplifier can be a power amplifier. In some embodiments, the envelope tracking bias circuit can be configured to provide a bias signal only to the peaking amplifier among the carrier and peaking amplifiers. In some embodiments, the envelope tracking bias circuit can be configured to provide a bias signal only to the output transistor of the cascode stage among the transistors of the peaking amplifier.

In some embodiments, each of the input and output transistors of the carrier amplifier and the peaking amplifier can be implemented as a bipolar-junction transistor having a base, an emitter, and a collector. The input transistor of the cascode stage can be implemented in a common-emitter configuration such that an input signal is received by its base, and its collector is coupled to the emitter of the output transistor of the cascode stage. The output transistor of the cascode stage can be implemented in a common-base configuration such that an output signal is provided through its collector, and the bias signal from the envelope tracking bias circuit is provided to its base.

In some embodiments, each of the input and output transistors of the carrier amplifier and the peaking amplifier can be implemented as a field-effect transistor having a gate, a source, and a drain. The input transistor of the cascode stage can be implemented in a common-source configuration such that an input signal is received by its gate, and its drain is coupled to the source of the output transistor of the cascode stage. The output transistor of the cascode stage can be implemented in a common-gate configuration such that an output signal is provided through its drain, and the bias signal from the envelope tracking bias circuit is provided to its gate.

In some embodiments, each of the carrier amplifier and the peaking amplifier can further include a driver stage implemented before the respective cascode stage. The driver stage of each of the carrier amplifier and the peaking amplifier can be configured to operate with a Class AB bias. The input transistor of the cascode stage of each of the carrier amplifier and the peaking amplifier can be configured to operate with a Class AB bias. The output transistor of the cascode stage of the carrier amplifier can be configured to operate with a substantially constant bias voltage.

In some embodiments, the Doherty amplifier can be configured to present a load current that is less than 10 mA to the envelope tracking bias circuit. In some embodiments, the Doherty amplifier can be configured to present a load current that is less than 5 mA to the envelope tracking bias circuit. In some embodiments, the load current of the Doherty amplifier presented to the envelope tracking bias circuit can be less than $1/100$ of a load current presented to a similar envelope tracking circuit that provides an envelope tracking supply voltage.

In some embodiments, the Doherty amplifier can be configured to present a load capacitance that is less than 100 pF to the envelope tracking bias circuit. In some embodiments, the Doherty amplifier can be configured to present a load capacitance that is less than 50 pF to the envelope tracking bias circuit. In some embodiments, the load capacitance of the Doherty amplifier presented to the envelope tracking bias circuit can be less than $1/5$ of a load capacitance presented to a similar envelope tracking circuit that provides an envelope tracking supply voltage.

In some implementations, the present disclosure relates to a Doherty amplifier that includes a carrier amplifier having a cascode stage with input and output transistors arranged in a cascode configuration. The Doherty amplifier further includes a peaking amplifier having a cascode stage with input and output transistors arranged in a cascode configuration. The output transistor of the cascode stage of the peaking amplifier is configured to receive and operate with a bias signal that is based on an envelope control signal.

According to some teachings, the present disclosure relates to a power amplifier module that includes a packaging substrate configured to receive a plurality of components, and a power amplifier system implemented on the packaging substrate. The power amplifier system includes a Doherty amplifier having a carrier amplifier and a peaking amplifier, with each of the carrier amplifier and the peaking amplifier including a cascode stage with input and output transistors arranged in a cascode configuration. The power amplifier system further includes an envelope tracking bias circuit coupled to the Doherty amplifier and configured to provide a bias signal to the output transistor of the cascode stage of the peaking amplifier.

In a number of implementations, the present disclosure relates to a wireless device that includes a transceiver configured to generate a signal for transmission, and a power amplifier system configured to amplify the signal. The power amplifier system includes a Doherty amplifier having a carrier amplifier and a peaking amplifier, with each of the carrier amplifier and the peaking amplifier including a cascode stage with input and output transistors arranged in a cascode configuration. The power amplifier system further includes an envelope tracking bias circuit coupled to the Doherty amplifier and configured to provide a bias signal to the output transistor of the cascode stage of the peaking amplifier. The wireless device further includes an antenna configured to support transmission of the amplified signal.

In accordance with a number of implementations, the present disclosure relates to an amplifier system that includes a quadrature amplifier having first and second amplifiers configured to amplify first and second signals in quadrature relative to each other. Each of the first and second amplifiers includes a cascode stage with input and output transistors arranged in a cascode configuration. The amplifier system further includes an envelope tracking bias circuit coupled to the quadrature amplifier and configured to provide a bias signal to the output transistor of the cascode stage of at least one of the first and second amplifiers.

In some embodiments, each of the first and second amplifiers can be a single ended amplifier. In some embodiments, each of the first and second amplifiers can be a Doherty amplifier. In some embodiments, the Doherty amplifier can be a power amplifier.

In some embodiments, the envelope tracking bias circuit can be configured to provide a common bias signal to each of the first and second amplifiers. In some embodiments, the envelope tracking bias circuit can be configured to provide a different bias signal to each of the first and second amplifiers. In some embodiments, the envelope tracking bias circuit can include a scaling/shifting circuit configured to generate the different bias signal to each of the first and second amplifiers. In some embodiments, the envelope tracking bias circuit can include a scaling/shifting/delay circuit configured to generate the different bias signal to each of the first and second amplifiers.

In some embodiments, the envelope tracking bias circuit can be configured to provide a bias signal only to the output transistor of the cascode stage among the transistors of the first and second amplifiers.

In some embodiments, each of the input and output transistors of the first amplifier and the second amplifier can be implemented as a bipolar-junction transistor having a base, an emitter, and a collector. The input transistor of the cascode stage can be implemented in a common-emitter configuration such that an input signal is received by its base, and its collector is coupled to the emitter of the output transistor of the cascode stage. The output transistor of the cascode stage can be implemented in a common-base configuration such that an output signal is provided through its collector, and the bias signal from the envelope tracking bias circuit is provided to its base.

In some embodiments, each of the input and output transistors of the first amplifier and the second amplifier can be implemented as a field-effect transistor having a gate, a source, and a drain. The input transistor of the cascode stage can be implemented in a common-source configuration such that an input signal is received by its gate, and its drain is coupled to the source of the output transistor of the cascode stage. The output transistor of the cascode stage can be implemented in a common-gate configuration such that an output signal is provided through its drain, and the bias signal from the envelope tracking bias circuit is provided to its gate.

In some embodiments, each of the first amplifier and the second amplifier can further include a driver stage implemented before the respective cascode stage.

In some embodiments, the quadrature amplifier can be configured to present a load current that is less than 10 mA to the envelope tracking bias circuit. In some embodiments, the quadrature amplifier can be configured to present a load current that is less than 5 mA to the envelope tracking bias circuit. The load current of the quadrature amplifier presented to the envelope tracking bias circuit can be less than $\frac{1}{100}$ of a load current presented to a similar envelope tracking circuit that provides an envelope tracking supply voltage.

In some embodiments, the quadrature amplifier can be configured to present a load capacitance that is less than 100 pF to the envelope tracking bias circuit. In some embodiments, the quadrature amplifier can be configured to present a load capacitance that is less than 50 pF to the envelope tracking bias circuit. The load capacitance of the quadrature amplifier presented to the envelope tracking bias circuit can be less than $\frac{1}{5}$ of a load capacitance presented to a similar envelope tracking circuit that provides an envelope tracking supply voltage.

In some implementations, the present disclosure relates to a quadrature amplifier that includes a first amplifier configured to amplify a first signal, and having a cascode stage with input and output transistors arranged in a cascode configuration. The quadrature amplifier further includes a second amplifier configured to amplify a second signal in quadrature with respect to the first signal, and having a cascode stage with input and output transistors arranged in a cascode configuration. The output transistor of the cascode stage of at least one of the first and second amplifiers is configured to receive and operate with a bias signal that is based on an envelope control signal.

In a number of teachings, the present disclosure relates to a radio-frequency module that includes a packaging substrate configured to receive a plurality of components, and an amplifier system implemented on the packaging substrate. The amplifier system includes a quadrature amplifier having first and second amplifiers configured to amplify first and second signals in quadrature relative to each other, with each of the first and second amplifiers including a cascode stage with input and output transistors arranged in a cascode configuration. The amplifier system further includes an envelope tracking bias circuit coupled to the quadrature amplifier and configured to provide a bias signal to the output transistor of the cascode stage of at least one of the first and second amplifiers.

In some implementations, the present disclosure relates to a wireless device that includes a transceiver configured to generate a signal for transmission, and a power amplifier system configured to amplify the signal. The power amplifier system includes a quadrature amplifier having first and second amplifiers configured to amplify first and second signals in quadrature relative to each other, with each of the first and second amplifiers including a cascode stage with input and output transistors arranged in a cascode configuration. The amplifier system further includes an envelope tracking bias circuit coupled to the quadrature amplifier and configured to provide a bias signal to the output transistor of the cascode stage of at least one of the first and second amplifiers. The wireless device further includes an antenna configured to support transmission of the amplified signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

A Doherty amplifier can provide significant efficiency advantages over a traditional single ended amplifier. For example, advanced modulation schemes with high peak to average ratios require an amplifier to be operated several dB from the maximum saturated output power (Psat) to maintain linearity. Since a Doherty amplifier typically has an efficiency peak 6 dB from Psat, linear efficiency can be improved. However, linearity is often compromised in a Doherty amplifier due to an inherent AMAM/AMPM discontinuity created as the carrier amplifier starts compressing.

Envelope tracking is another technique for achieving high efficiency at, for example, 6 dB power back-off (PBO). Such a technique typically requires an envelope tracking supply modulator, as well as system calibration and pre-distortion. For an envelope tracking supply modulator, performance (e.g., bandwidth/efficiency) is typically a function of a load current/capacitance presented by the power amplifier. Lower load currents/capacitance typically improve the performance.

Described herein are examples related to Doherty and/or quadrature amplifiers that can be operated with an envelope tracking system, to improve performance of the amplifier (e.g., high efficiency) as well as an envelope tracking modulator (e.g., reduced load current and capacitance). While various examples are described herein in the context of power amplifiers, it will be understood that one or more features of the present disclosure can also be implemented with other types of amplifiers.

Figure 1:
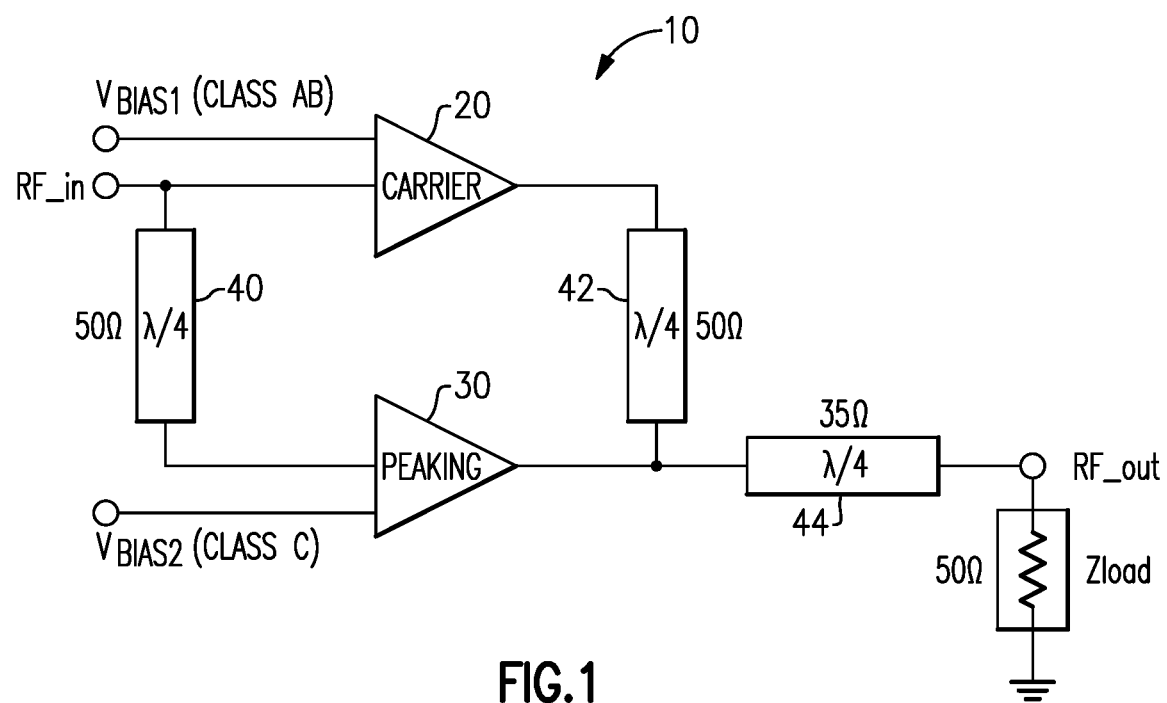
FIG. 1 shows a traditional Doherty power amplifier configured to receive a signal at an input and generate an amplified signal at an output.

FIG. 1 shows a traditional Doherty power amplifier 10 configured to receive a signal at an input (RF_in) and generate an amplified signal at an output (RF_out). The Doherty power amplifier 10 includes a carrier amplifier 20 and a peaking amplifier 30. In the example shown in FIG. 1, the input signal is split into the carrier amplification path with the carrier amplifier 20, and into the peaking amplification path with the peaking amplifier 30. The split signal into the peaking amplifier 30 can be passed through a quarter-wave transformer 40. Similarly, the output of the carrier amplifier 20 can be passed through a quarter-wave transformer 42 before being combined with the output of the peaking amplifier 30. The combined signal can be passed through another quarter-wave transformer 44 to provide the amplified signal at the output (RF_out).

Figure 2:
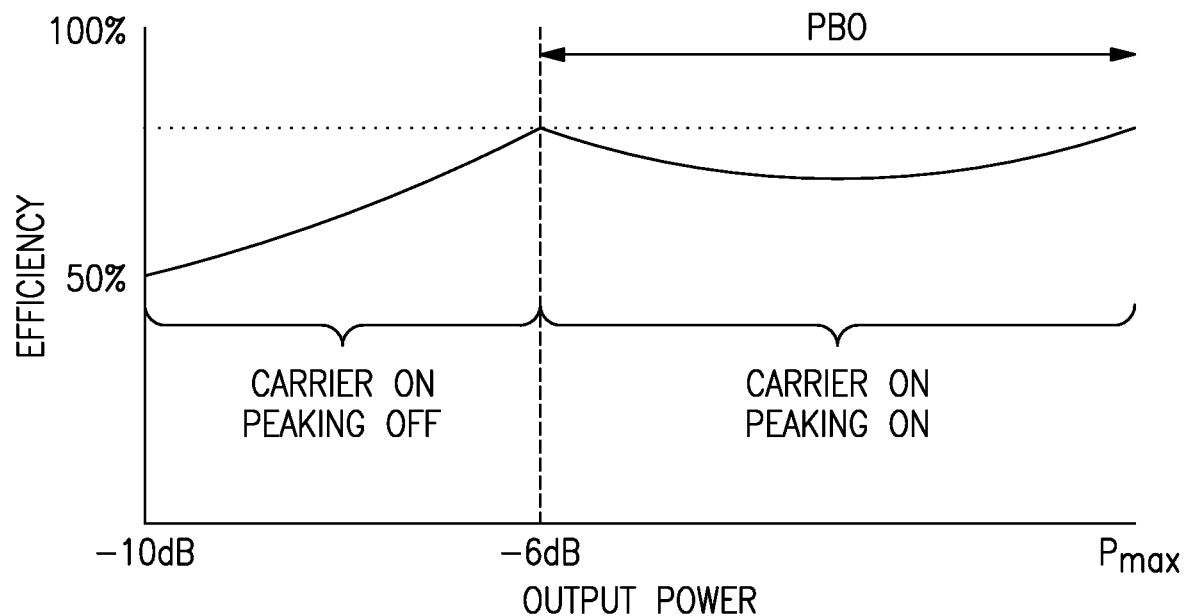
FIG. 2 shows an example of a peak in efficiency at a power back-off level for the Doherty power amplifier of FIG. 1.
Figure 3:
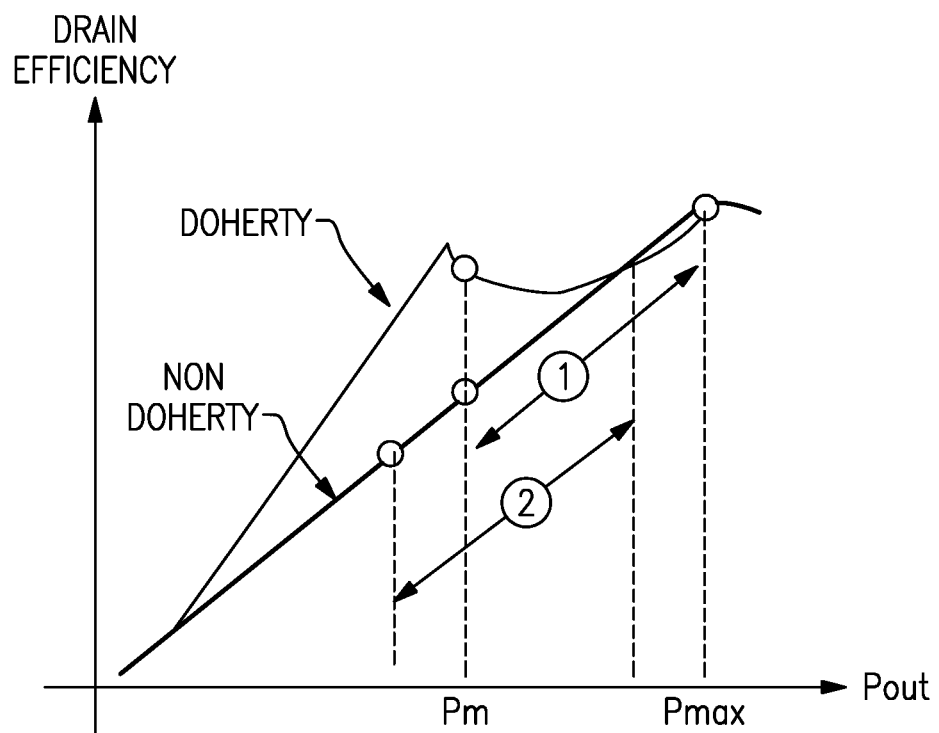
FIG. 3 shows that the efficiency of the traditional Doherty power amplifier at the efficiency peak of FIG. 2 can be significantly higher than that of a non-Doherty power amplifier at the same output power level.

The example traditional Doherty power amplifier 10 of FIG. 1 combines the respective amplified signals from the carrier and peaking amplifiers 20, 30 to achieve high efficiency at a power back-off (PBO) level (e.g., 6 dB). For example, FIG. 2 shows a peak in efficiency at the example PBO of 6 dB. Such a peak in efficiency typically occurs at or near the output power level when the peaking amplifier is turned on. FIG. 3 shows that the efficiency of the traditional Doherty power amplifier at the foregoing efficiency peak can be significantly higher than that of a non-Doherty power amplifier at the same output power level (e.g., 6 dB PBO).

Figure 4:
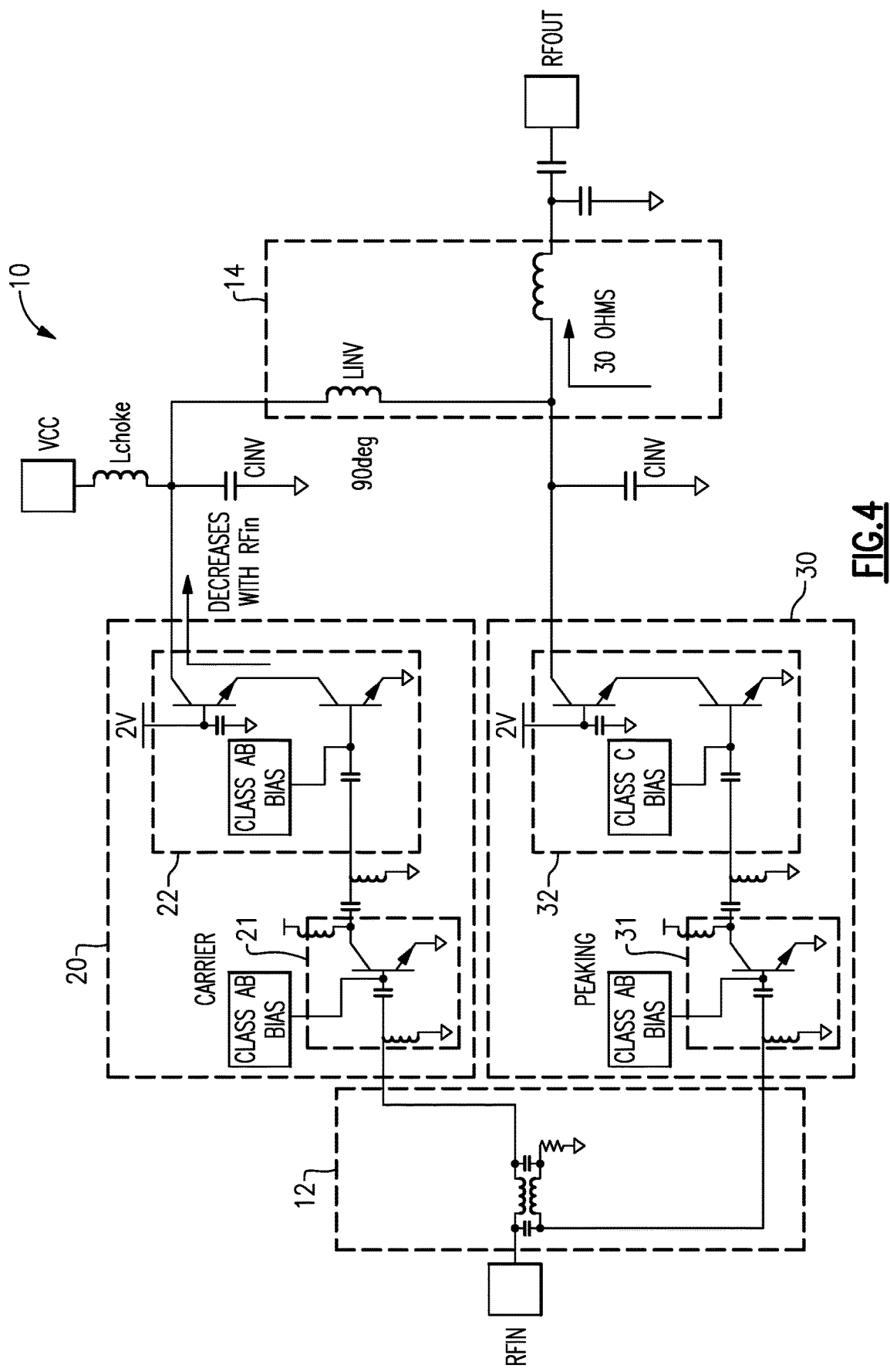
FIG. 4 shows a more specific example of the Doherty power amplifier of FIG. 1.

FIG. 4 shows a more specific example of the Doherty power amplifier 10 of FIG. 1. In FIG. 4, a Doherty power amplifier 10 is shown to include a splitter circuit 12 that splits an input signal received at an input (RFIN) into a carrier amplifier 20 and a peaking amplifier 30. The Doherty power amplifier 10 is shown to further include a combiner circuit 14 configured to combine the respective amplified signals from the carrier amplifier 20 and the peaking amplifier 30.

In the example of FIG. 4, each of the carrier amplifier 20 and the peaking amplifier 30 is shown to have a two stage configuration, with the second stage being configured in a cascode configuration. More particularly, the carrier amplifier 20 includes a first amplification stage 21 and a second amplification stage 22, with the second amplification stage 22 being configured in a cascode configuration. Similarly, the peaking amplifier 30 includes a first amplification stage 31 and a second amplification stage 32, with the second amplification stage 32 being configured in a cascode configuration.

Figure 5:
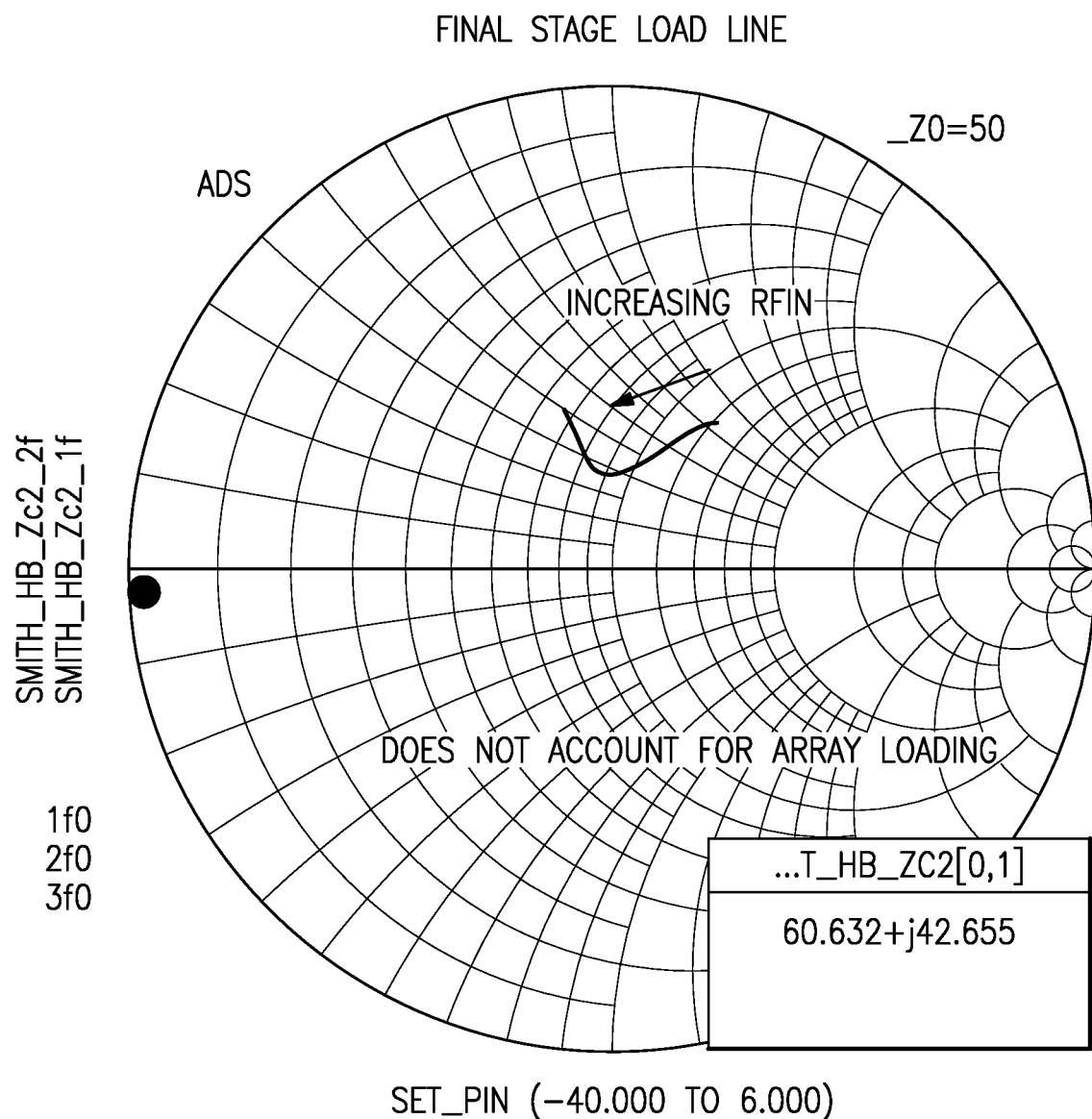
FIG. 5 shows an example of a change in final stage load impedance as the input power changes for the Doherty power amplifier of FIG. 4.

The carrier amplifier 20 of the Doherty power amplifiers of FIGS. 1 and 4 can be configured to operate with, for example, a Class AB bias, and the peaking amplifier 30 can be configured to operate with, for example, a Class C bias. In some embodiments, load modulation of the carrier amplifier and the power contribution of the peaking amplifier is typically a function of input power. For example, FIG. 5 shows a change in final stage load impedance as the input power changes.

Referring to the example Doherty power amplifier of FIG. 4, the first amplification stage 21 of the carrier amplifier 20 is shown to be provided with a Class AB bias; and the input amplifying transistor of the cascode-configured second amplification stage 22 of the carrier amplifier 20 is also shown to be provided with a Class AB bias. The cascode transistor of the cascode-configured second amplification stage 22 of the carrier amplifier 20 is shown to be provided with a constant bias voltage at its base/gate, and such a base/gate is shown to be coupled to ground through a capacitance.

Referring to the example Doherty power amplifier of FIG. 4, the first amplification stage 31 of the peaking amplifier 30 is shown to be provided with a Class AB bias; and the input amplifying transistor of the cascode-configured second amplification stage 32 of the peaking amplifier 30 is also shown to be provided with a Class C bias. The cascode transistor of the cascode-configured second amplification stage 32 of the peaking amplifier 30 is shown to be provided with a constant bias voltage at its base/gate, and such a base/gate is shown to be coupled to ground through a capacitance.

Figure 6:
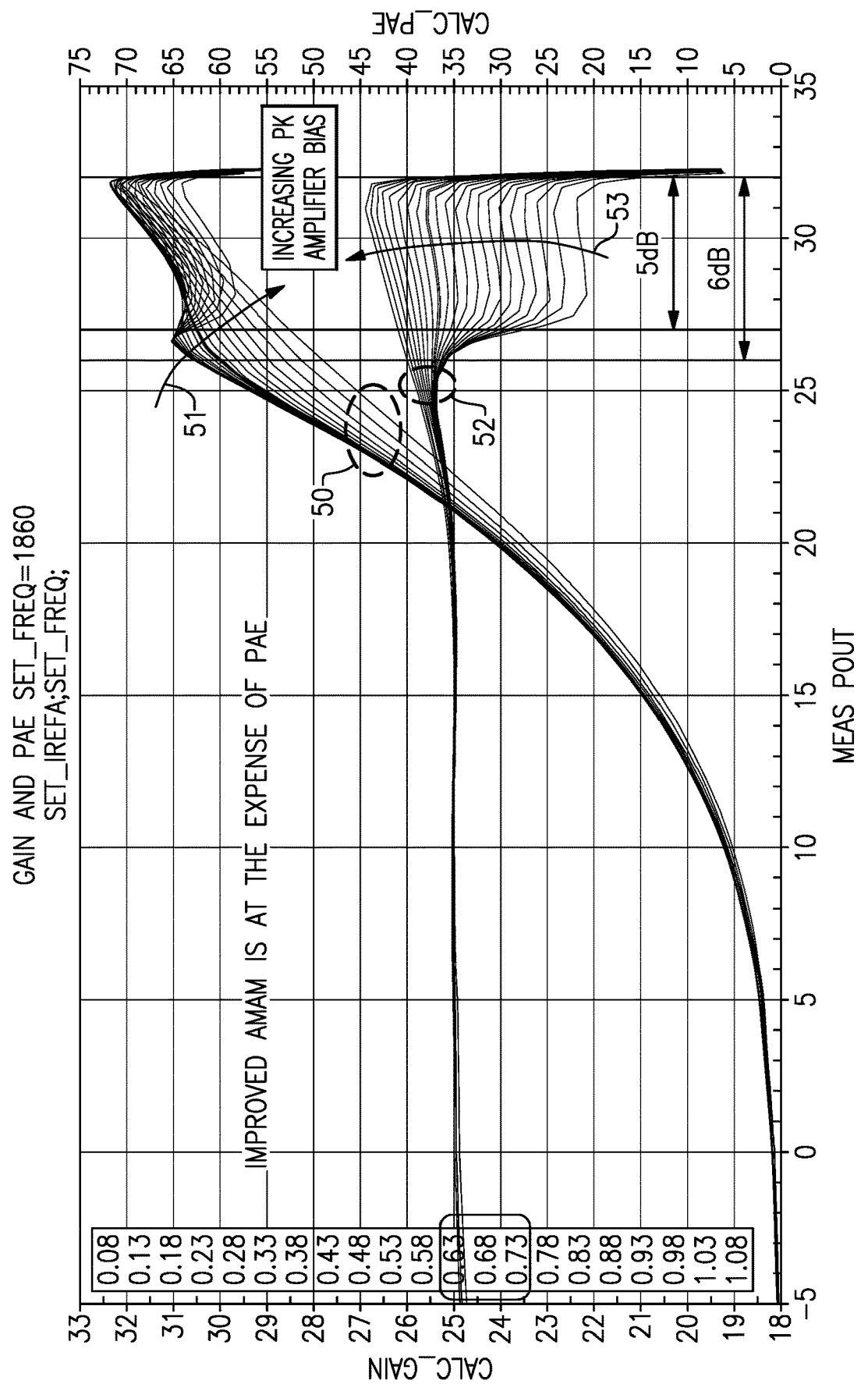
FIG. 6 shows an example of a tradeoff between power added efficiency (PAE) and linearity for the Doherty power amplifier of FIG. 4, by sweeping a Class C bias point of the second amplification stage of the peaking amplifier.

It is also noted that the Doherty power amplifier of FIG. 4 can suffer from a tradeoff between power added efficiency (PAE) at 6 dB PBO and linearity. For example, FIG. 6 shows such a tradeoff by sweeping the Class C bias point of the second amplification stage 32 of the peaking amplifier 30. In FIG. 6, a group of PAE plots 50 shows that as AMAM linearity is improved (with an increase in peak amplifier bias (arrow 51)), the PAE at 6 dB PBO is degraded. Also in FIG. 6, a group of gain plots 52 shows that uniformity of gain at a PBO range (e.g., 5 dB PBO) can change as the peak amplifier bias is changed (arrow 53).

Figure 7:
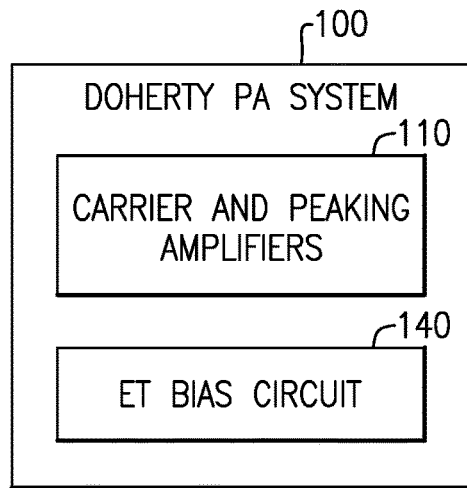
FIG. 7 depicts a block diagram of a Doherty power amplifier system having one or more features as described herein.

FIG. 7 depicts a block diagram of a Doherty power amplifier system 100 that can address some or all of the features and/or challenges described above in reference to FIGS. 1-6. In some embodiments, such a Doherty power amplifier system can includes carrier and peaking amplifiers (collectively indicated as 110), and an envelope tracking (ET) bias circuit 140. Examples related to such a Doherty power amplifier system are described herein in greater detail.

Figure 8:
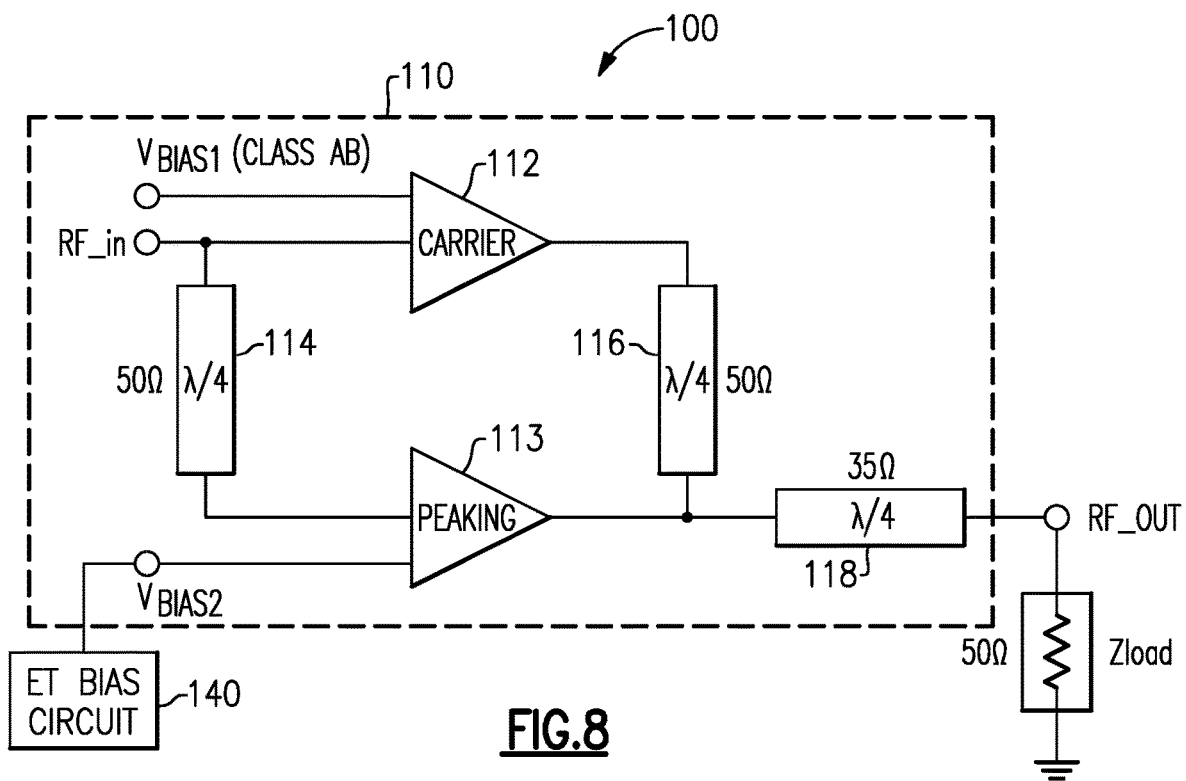
FIG. 8 shows a Doherty power amplifier system having a Doherty power amplifier and an envelope tracking (ET) bias circuit.

FIG. 8 shows a Doherty power amplifier system 100 having a Doherty power amplifier 110 and an envelope tracking (ET) bias circuit 140. Similar to the example of FIG. 1, the Doherty power amplifier 110 of FIG. 8 can be configured to receive a signal at an input (RF_in) and generate an amplified signal at an output (RF_out). The Doherty power amplifier 110 includes a carrier amplifier 112 and a peaking amplifier 113. In the example shown in FIG. 8, the input signal is split into the carrier amplification path with the carrier amplifier 112, and into the peaking amplification path with the peaking amplifier 113. In some embodiments, the split signal into the peaking amplifier 113 can be passed through a quarter-wave transformer 114. Similarly, the output of the carrier amplifier 112 can be passed through a quarter-wave transformer 116 before being combined with the output of the peaking amplifier 113. The combined signal can be passed through another quarter-wave transformer 118 to provide the amplified signal at the output (RF_out).

In some embodiments, a least some portion of the Doherty power amplifier of FIG. 8 can be configured to receive and operate with a bias signal based on an ET control signal provided by the ET bias circuit 140. For example, the carrier amplifier 112 of the Doherty power amplifier 110 of FIG. 8 can be provided with a Class AB bias, similar to the example of FIG. 1; and at least a portion of the peaking amplifier 113 of the Doherty power amplifier 110 can be provided with an ET control signal as a bias signal.

Figure 9:
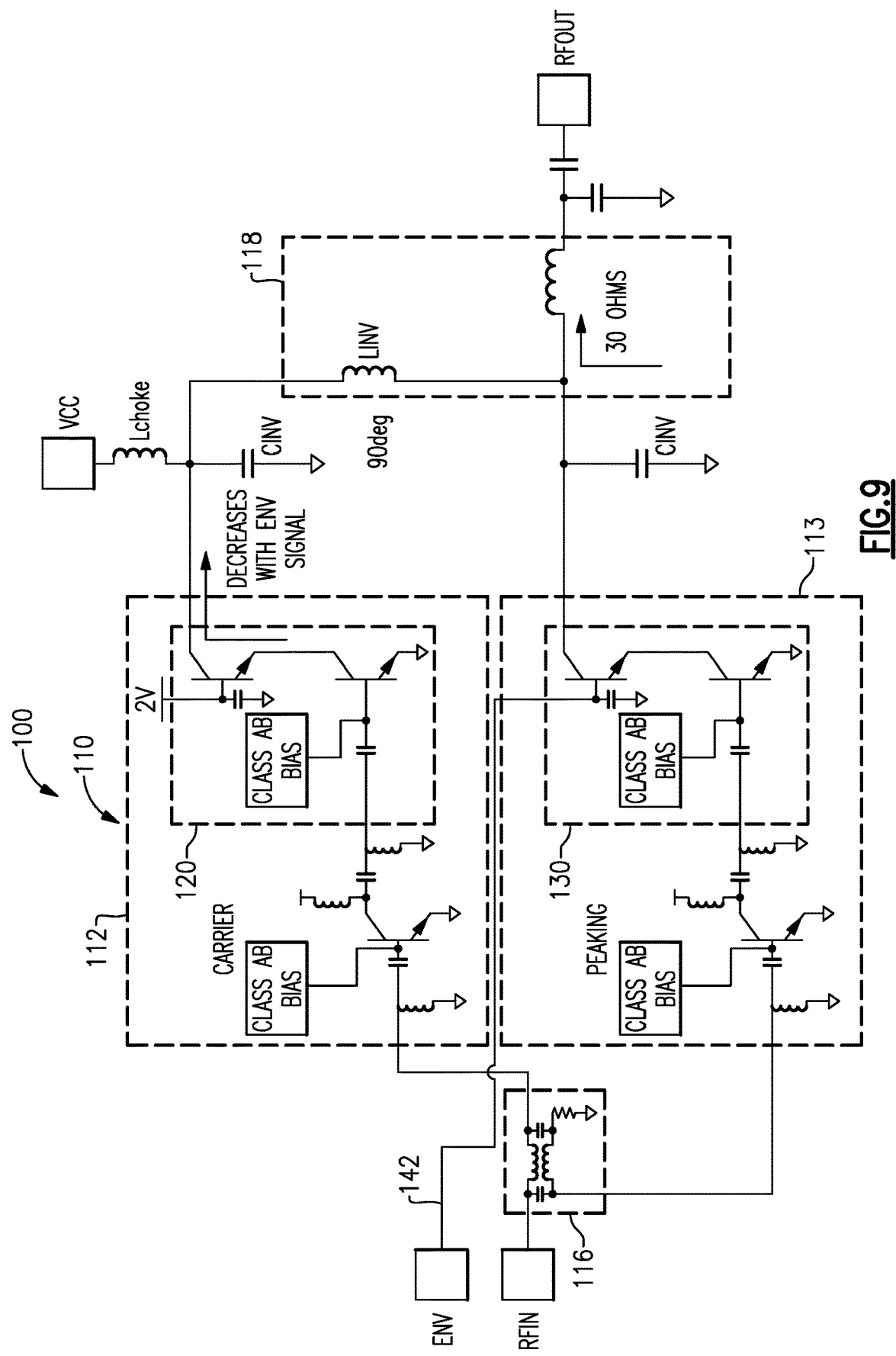
FIG. 9 shows a more specific example of the Doherty power amplifier system of FIG. 8.

FIG. 9 shows a more specific example of the Doherty power amplifier system of FIG. 8. In FIG. 9, a Doherty power amplifier system 100 is shown include a Doherty power amplifier 110 configured to receive an ET control signal from an ET bias circuit (140 in FIG. 8) through a node ENV and a path 142.

In the example of FIG. 9, the Doherty power amplifier 110 is shown to include a splitter circuit 116 that splits an input signal received at an input (RFIN) into a carrier amplifier 112 and a peaking amplifier 113. The Doherty power amplifier 110 is shown to further include a combiner circuit 118 configured to combine the respective amplified signals from the carrier amplifier 112 and the peaking amplifier 113.

In the example of FIG. 9, each of the carrier amplifier 112 and the peaking amplifier 113 is shown to have a two stage configuration, with the second stage being configured in a cascode configuration. More particularly, the carrier amplifier 112 includes a first amplification stage and a second amplification stage 120, with the second amplification stage 120 being configured in a cascode configuration. Similarly, the peaking amplifier 113 includes a first amplification stage and a second amplification stage 130, with the second amplification stage 130 being configured in a cascode configuration.

In some embodiments, the carrier amplifier 112 of the Doherty power amplifier 110 of FIG. 8 can be configured to operate with a Class AB bias. For example, the first amplification stage of the carrier amplifier 112 is shown to be provided with a Class AB bias; and the input amplifying transistor of the cascode-configured second amplification stage 120 of the carrier amplifier 112 is also shown to be provided with a Class AB bias. The cascode transistor of the cascode-configured second amplification stage 120 of the carrier amplifier 112 is shown to be provided with a constant bias voltage at its base/gate, and such a base/gate is shown to be coupled to ground through a capacitance.

In some embodiments, the first amplification stage of the peaking amplifier 113 can be provided with a Class AB bias; and the input amplifying transistor of the cascode-configured second amplification stage 130 of the peaking amplifier 113 can also be provided with a Class AB bias. In some embodiments, the cascode transistor of the cascode-configured second amplification stage 130 of the peaking amplifier 113 can be configured to be provided with and operate with a bias signal based on an ET control signal provided from the ET bias circuit (e.g., 140 in FIG. 8), through the node ENV and the path 142. In the example of FIG. 9, such an ET-based bias signal is shown to be provided to a base/gate of the cascode transistor of the cascode-configured second amplification stage 130 of the peaking amplifier 113. In some embodiments, such a base/gate can be coupled to ground through a capacitance.

It will be understood that a Doherty power amplifier having one or more features as described herein can be configured to receive and operate with an ET-based bias signal at one or more other amplifying transistors. It will also be understood that a Doherty power amplifier having one or more features as described herein can be implemented with field-effect transistors (FETs), bipolar-junction transistors (BJTs), or some combination thereof.

Figure 10:
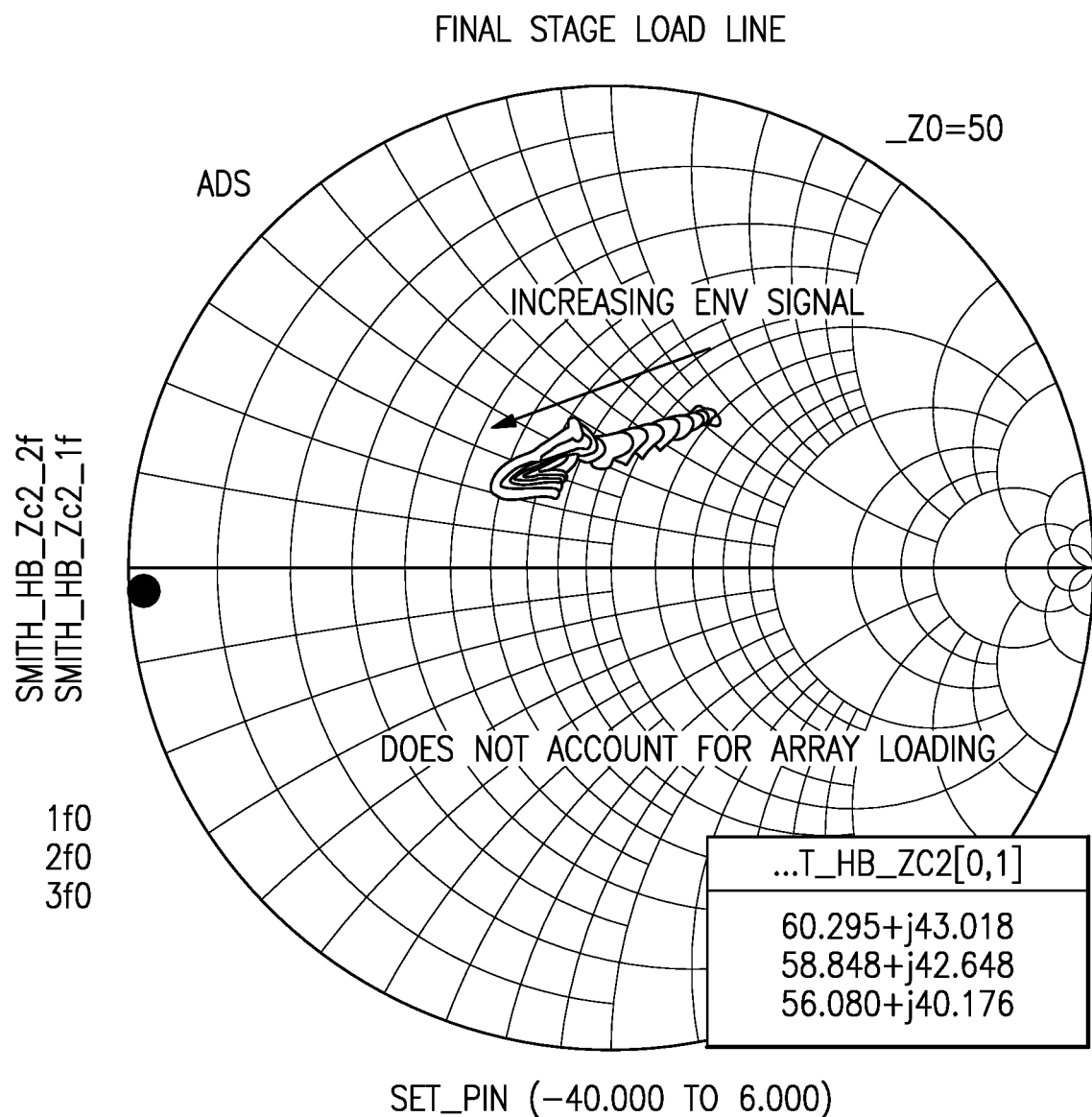
FIG. 10 shows an example of a change in final stage load impedance as the envelope control voltage changes for the Doherty power amplifier system of FIG. 9.

In some embodiments, a Doherty power amplifier (e.g., 110 in FIGS. 8 and 9) having one or more features as described herein can be configured to combine signals from carrier and peaking amplifiers to achieve high efficiency at, for example, 6 dB PBO. It is noted that load modulation of the carrier amplifier (112 in FIG. 9) and power contribution of the peaking amplifier (113 in FIG. 9) is now a function of the ET control signal (e.g., envelope control voltage). For example FIG. 10 shows a change in final stage load impedance as the envelope control voltage changes.

FIGS. 11-18 show examples of performance characteristics of the example Doherty power amplifier 110 of FIG. 9.

Figure 11:
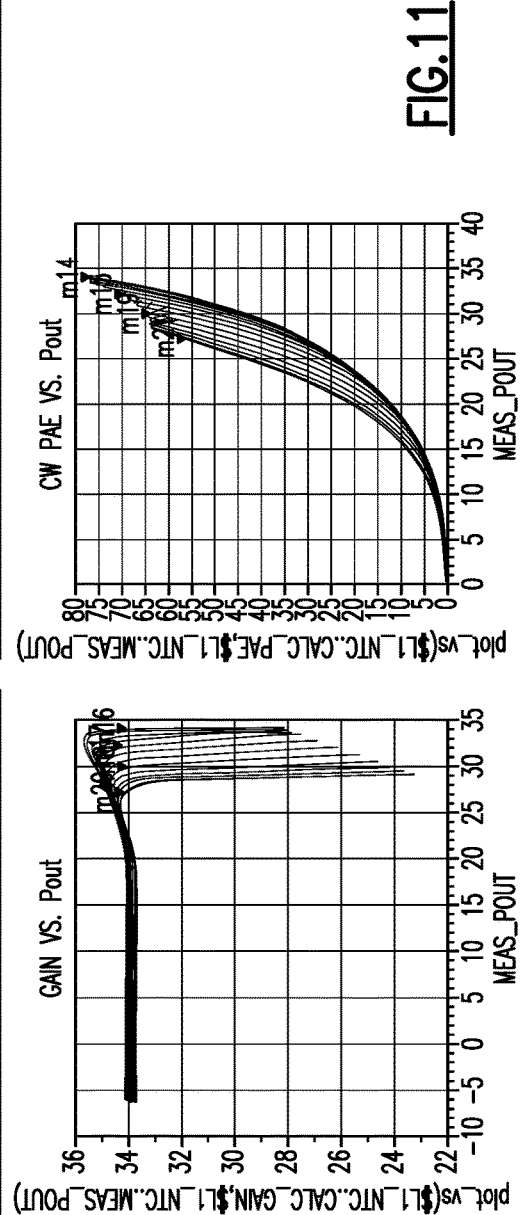
FIG. 11 shows examples of gain and power added efficiency (PAE) for different envelope control voltages provided to the cascode transistor of the peaking amplifier of FIG. 9.

In FIG. 11, gain (left panel) and PAE (right panel) are shown for different envelope control voltages provided to the cascode transistor of the peaking amplifier 113 of FIG. 9. It is noted that such plots are generally consistent with envelope tracking power amplifiers. Referring to the gain plot of FIG. 11, it is further noted that 7 dB of usable high PAE dynamic range is provided in the Doherty power amplifier 110 of FIG. 9.

Figure 12:
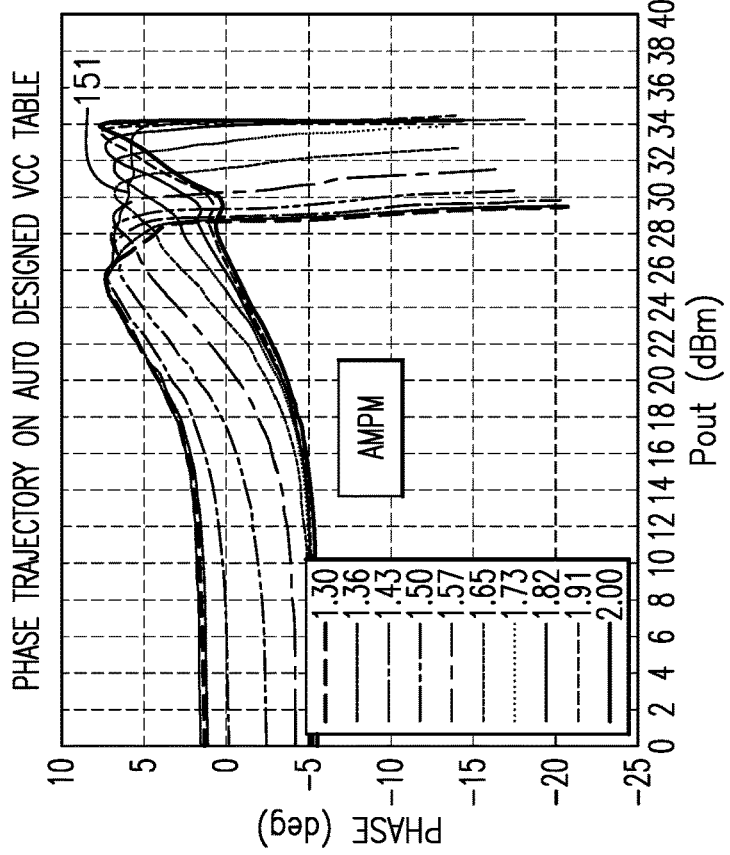
FIG. 12 shows examples of AMAM and AMPM plots for different envelope control voltages provided to the cascode transistor of the peaking amplifier of FIG. 9.
Figure 12:
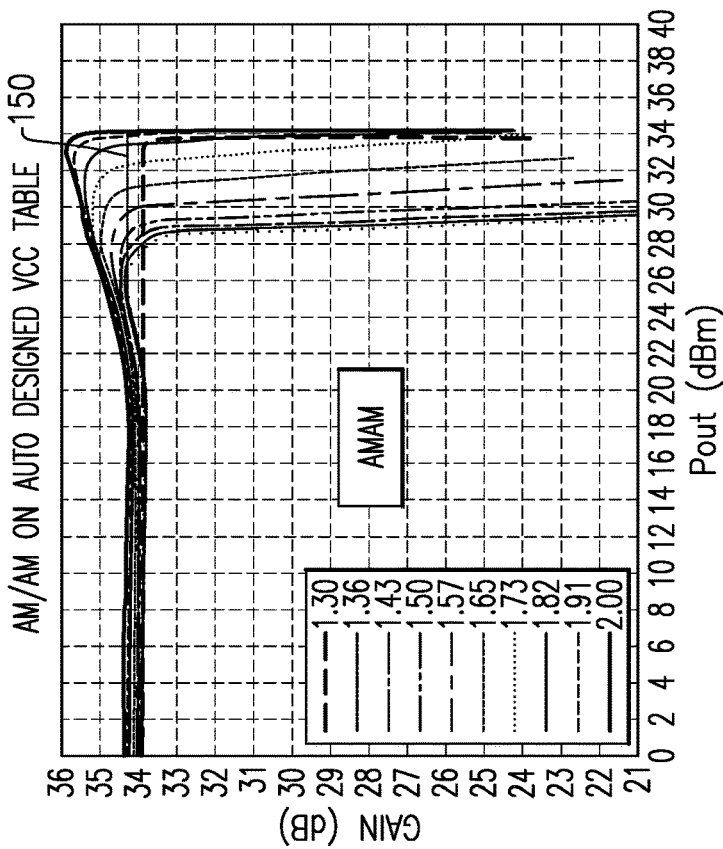

In FIG. 12, AMAM (left panel) and AMPM (right panel) plots are shown for different envelope control voltages provided to the cascode transistor of the peaking amplifier 113 of FIG. 9. Also shown are calibrated AMAM plot 150 and calibrated AMPM plot 151 based on the operation of the power amplifier 110 with an envelope control based bias signal.

Figure 13:
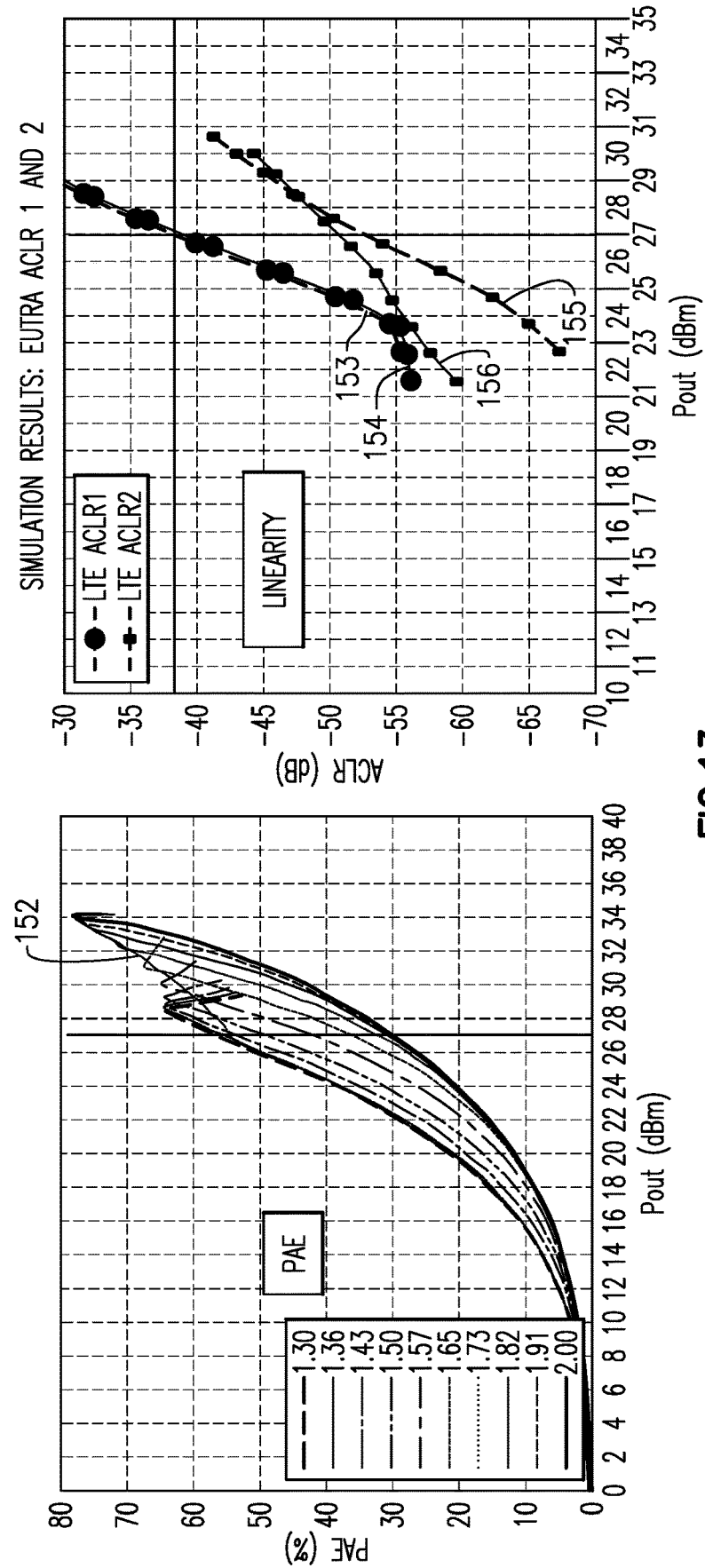
FIG. 13 shows examples of PAE and linearity plots for different envelope control voltages provided to the cascode transistor of the peaking amplifier of FIG. 9.

In FIG. 13, PAE (left panel) and linearity (right panel) plots are shown. More particularly, the PAE plots on the left panel are for different envelope control voltages provided to the cascode transistor of the peaking amplifier 113 of FIG. 9, and a PAE curve 152 represents a calibrated PAE contour with an envelope control based bias signal.

Referring to the linearity plots on the right panel of FIG. 13, curves 153 (LTE ACLR1) and 155 (LTE ACLR2) are for a non-Doherty envelope tracking power amplifier operating at 8V, and curves 154 (LTE ACLR1) and 156 (LTE ACLR2) are for the Doherty envelope tracking power amplifier of FIG. 9 operating at 11V.

Figure 14:
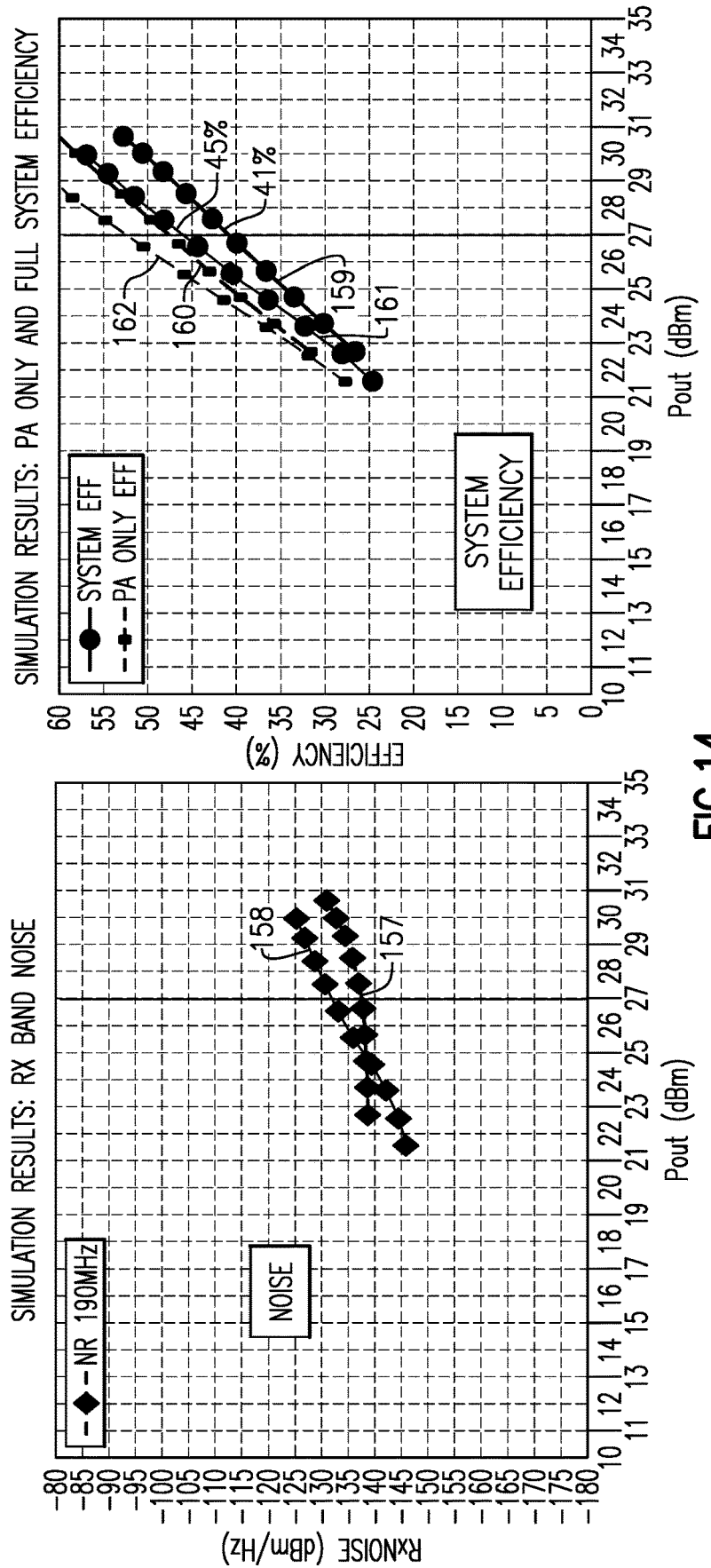
FIG. 14 shows examples of noise and system efficiency plots for the amplifier of FIG. 9.

In FIG. 14, noise (left panel) and system efficiency (right panel) plots are shown. More particularly, plot 157 of the left panel is for a noise in a receive (Rx) band resulting from operation of a non-Doherty envelope tracking power amplifier, and plot 158 is for a noise in the receive (Rx) band resulting from operation of the Doherty envelope tracking power amplifier of FIG. 9.

Referring to FIG. 14, plot 160 in the right panel is for an efficiency of power amplifier-only for a non-Doherty envelope tracking power amplifier, and plot 162 is for an efficiency of power amplifier-only for the Doherty envelope tracking power amplifier of FIG. 9. Further, plot 159 in the right panel is for an efficiency of the system associated with the non-Doherty envelope tracking power amplifier, and plot 161 is for an efficiency of the system (100) associated with the Doherty envelope tracking power amplifier of FIG. 9. It is noted that the system efficiency (45%) associated with the Doherty envelope tracking power amplifier of FIG. 9 is significantly higher than that of the non-Doherty envelope tracking power amplifier.

Figure 15:
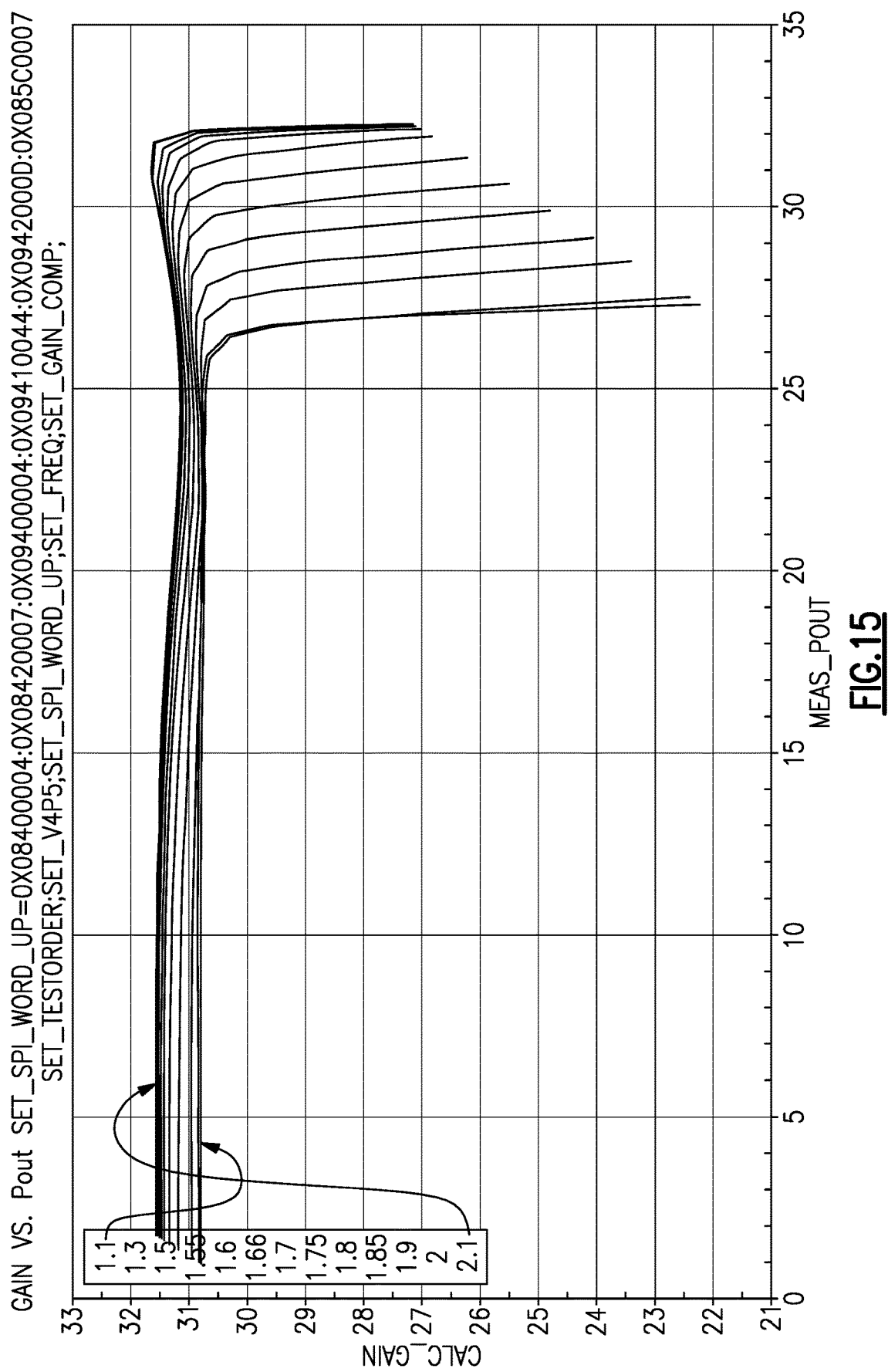
FIG. 15 shows measured AMAM waterfall plots for different envelope control voltages provided to the Doherty envelope tracking power amplifier of FIG. 9.
Figure 16:
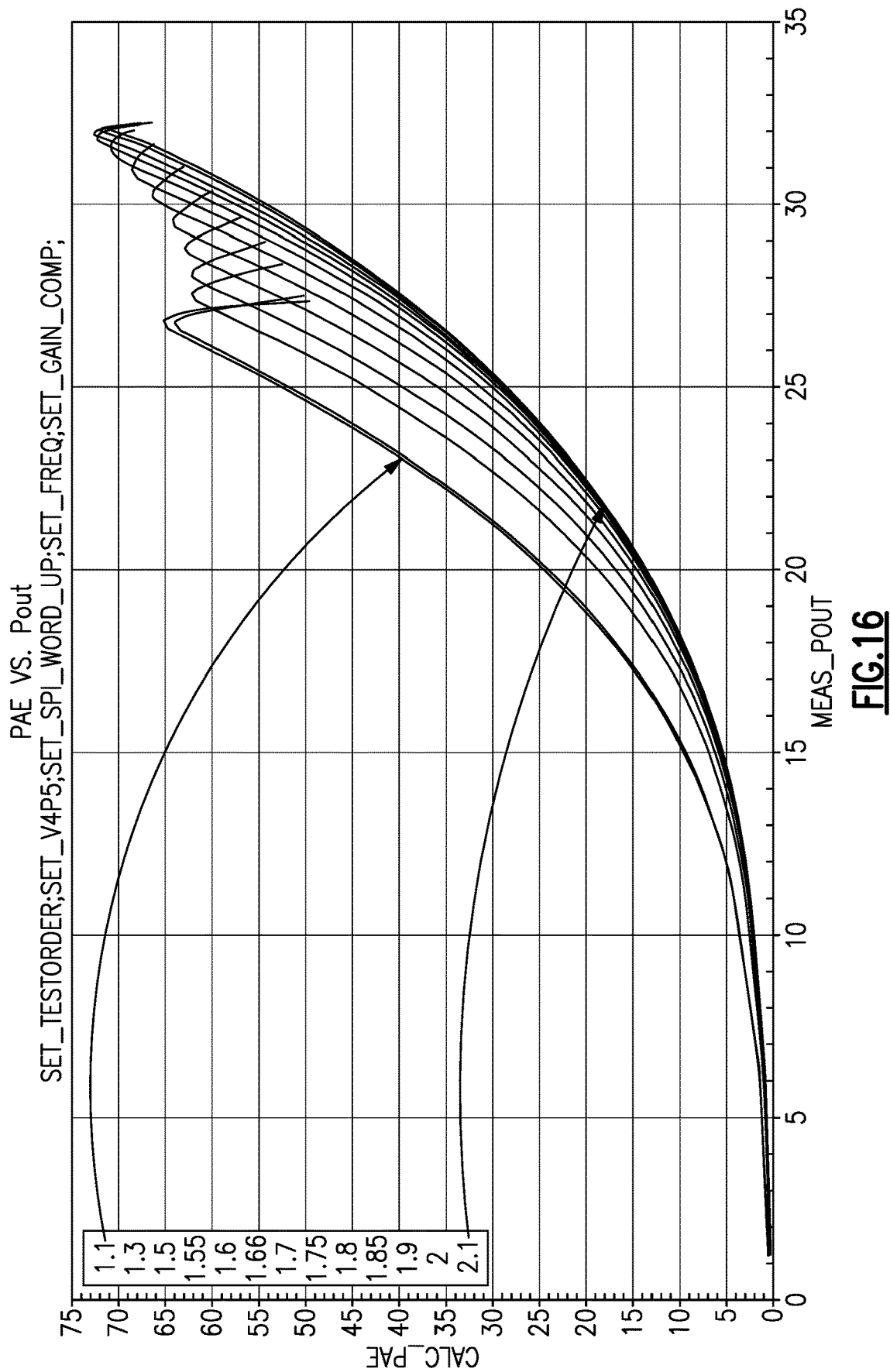
FIG. 16 shows measured PAE waterfall plots for different envelope control voltages provided to the Doherty envelope tracking power amplifier of FIG. 9.
Figure 17:
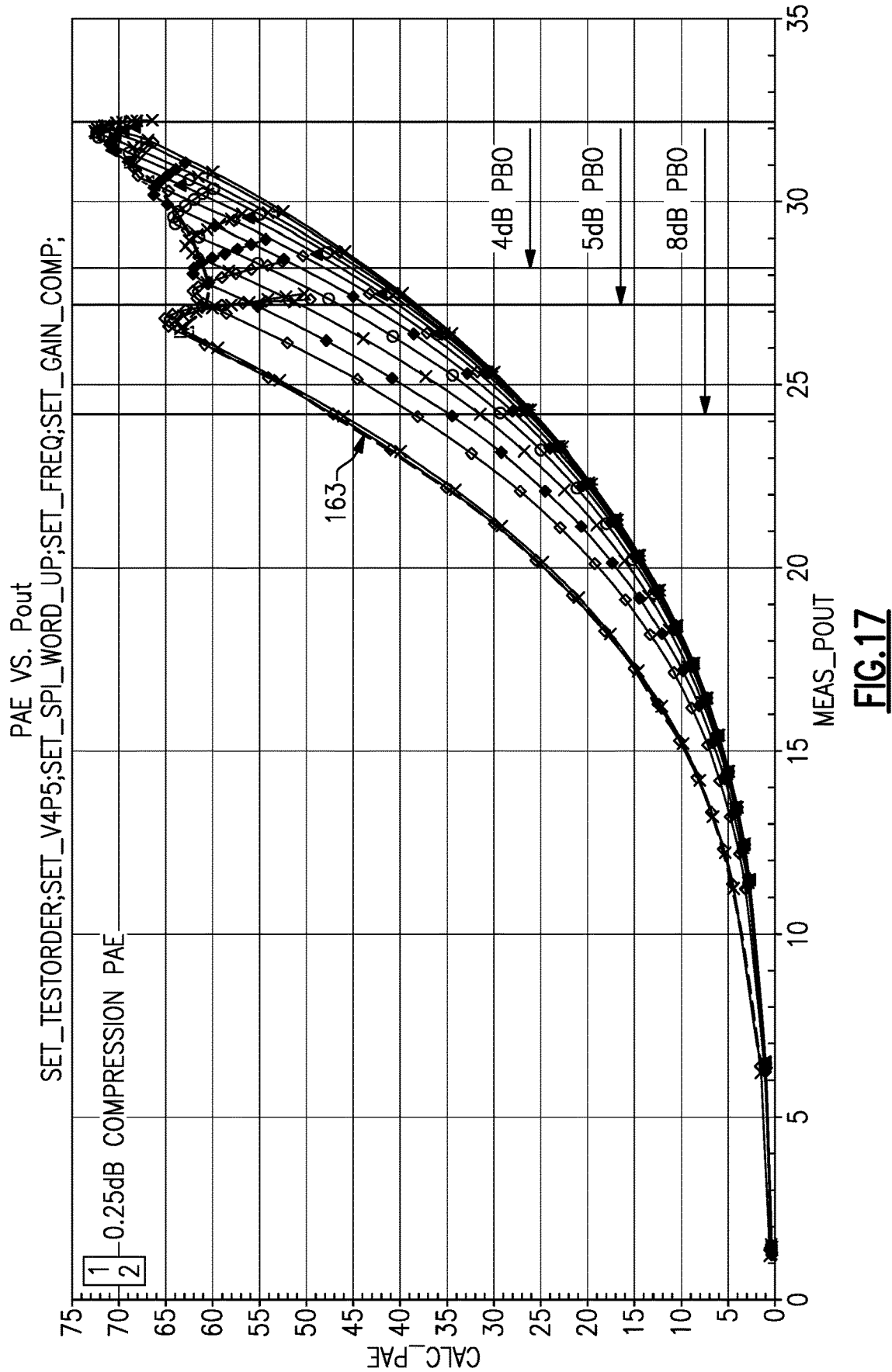
FIG. 17 shows the measured PAE waterfall plots of FIG. 16, along with a curve representative of a high PAE for the example envelope control voltage range.

In FIG. 15, measured AMAM waterfall plots are shown for different envelope control voltages provided to the Doherty envelope tracking power amplifier of FIG. 9. In FIG. 16, measured PAE waterfall plots are shown for different envelope control voltages provided to the Doherty envelope tracking power amplifier of FIG. 9. In FIG. 17, measured PAE waterfall plots of FIG. 16 are shown, along with a curve 163 representative of a high PAE for the example envelope control voltage range. For such a high PAE curve, example PAE values are shown for different PBO levels.

In some embodiments, a Doherty power amplifier system having one or more features as described herein can be configured to be significantly more efficient than an envelope tracking system associated with a non-Doherty power amplifier. For example, FIG. 14 shows that the Doherty power amplifier system of FIGS. 8 and 9 has a significantly higher system efficiency than that of a non-Doherty power amplifier system. Such an improvement in system efficiency can be due to, for example, reduced envelope control current, reduced load capacitance associated with an envelope control signal, or some combination thereof.

Figure 18:
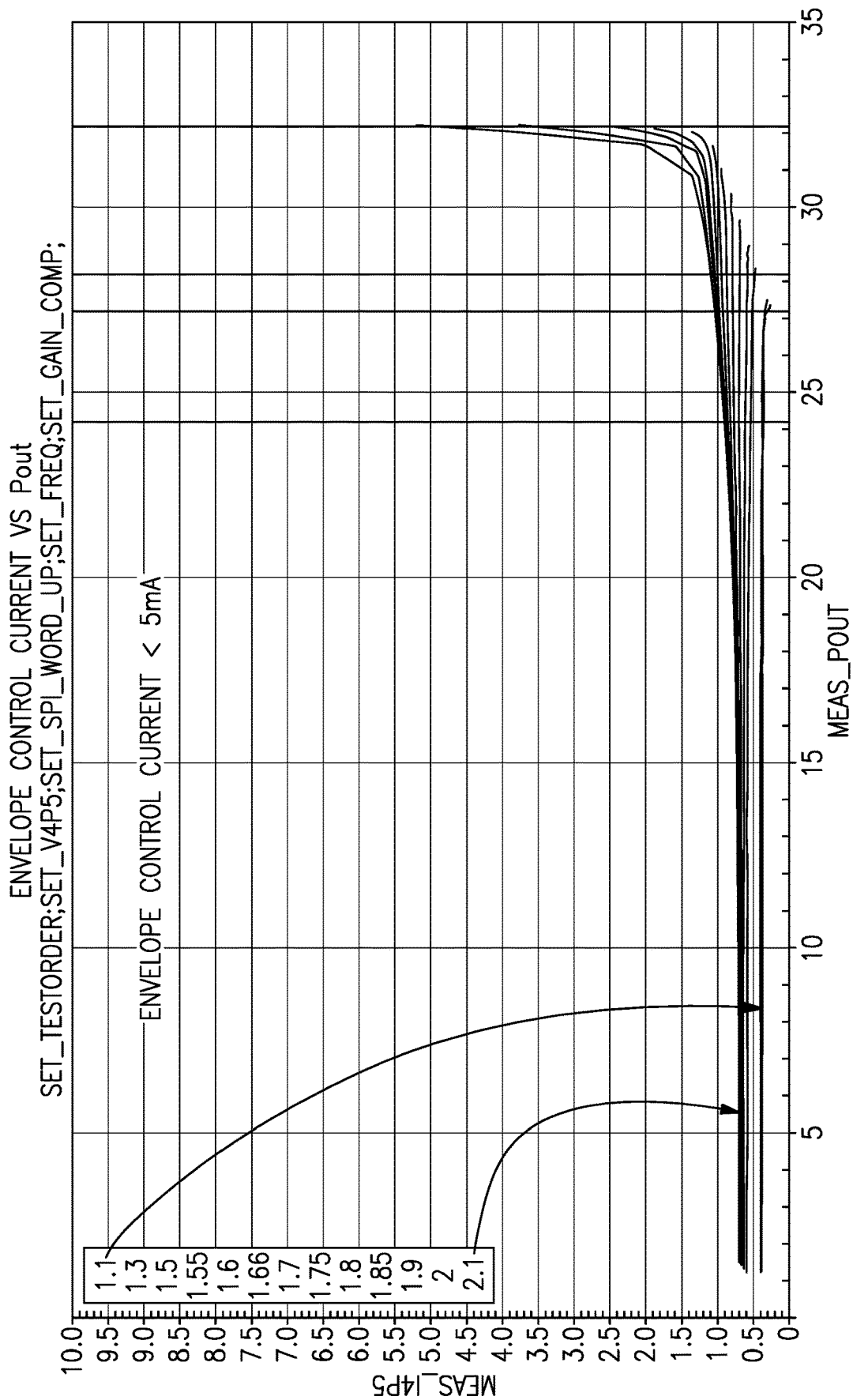
FIG. 18 shows plots of envelope control current for different envelope control voltages provided to the cascode transistor of the peaking amplifier of FIG. 9.

FIG. 18 shows plots of envelope control current for different envelope control voltages provided to the cascode transistor of the peaking amplifier 113 of FIG. 9. One can see that for essentially all of the output power range, such envelope control current values are less than 5 mA. For comparison, typical load current values associated with a non-Doherty envelope tracking power amplifier system are in a range of about 500 mA to 1,000 mA.

Figure 19:
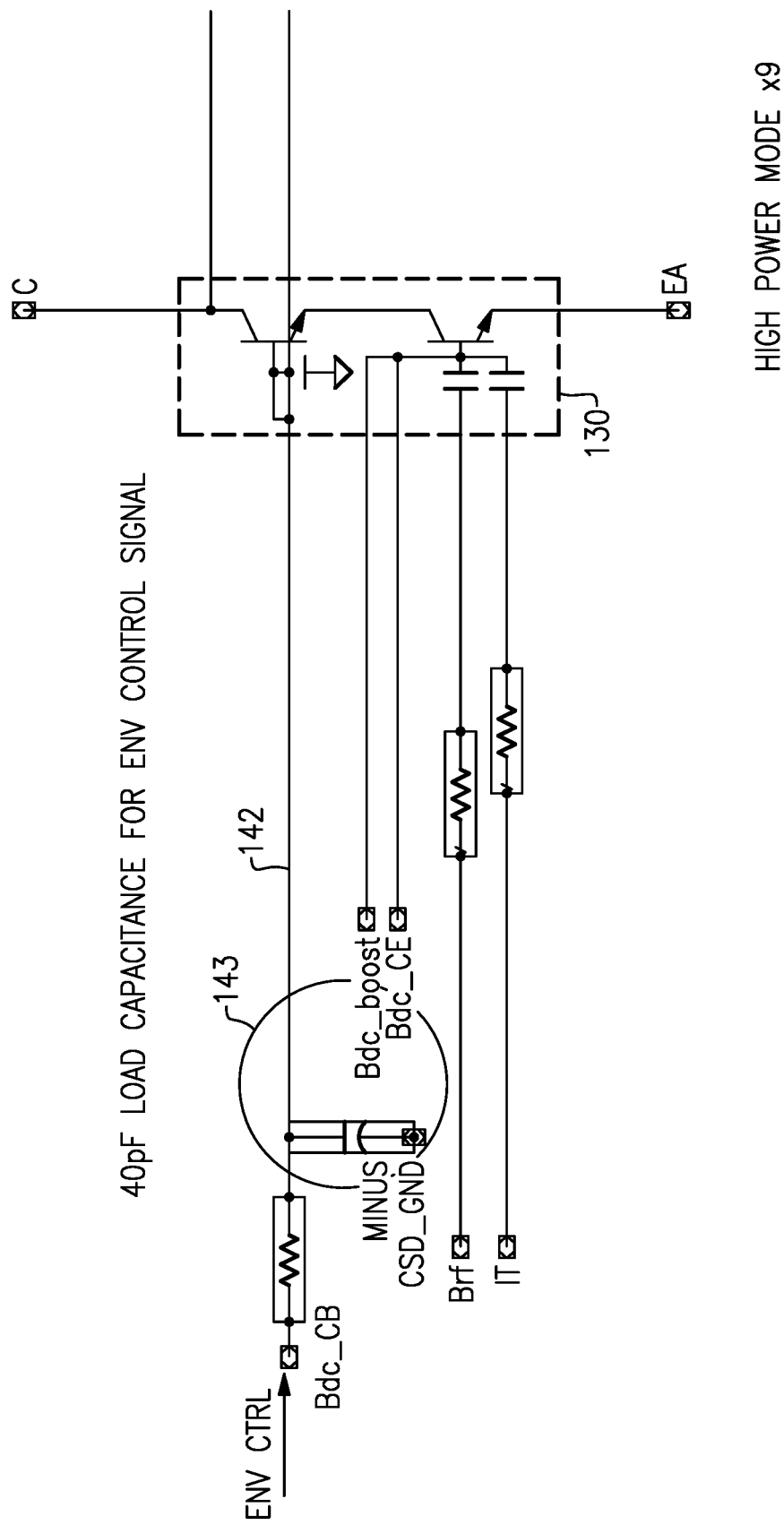
FIG. 19 shows a representative load capacitance associated with delivery of an envelope control voltage to the cascode transistor of the peaking amplifier of FIG. 9.

FIG. 19 shows a representative load capacitance 143 associated with delivery of the envelope control voltage (through the path 142) to the cascode transistor of the peaking amplifier 113 of FIG. 9. In FIG. 19, such a load capacitance is shown to have a value of about 40 pF. Accordingly, one can expect a load capacitance that is less than 50 pF for a Doherty power amplifier system having one or more features as described herein. For comparison, typical load capacitance values associated with a non-Doherty envelope tracking power amplifier system are in a range of about 250 pF to 500 pF.

As described herein, an envelope control signal can be provided to a cascode-configured amplification stage of a Doherty power amplifier. In the example of FIG. 9, such a cascode-configured amplification stage is a second stage (130) that follows a first stage. It will be understood that a Doherty power amplifier having one or more features as described herein may or may not have such a first stage. Accordingly, a cascode-configured amplification stage that receives and operates with an envelope control signal can be the only amplification stage, or be one of a plurality of amplification stages, of a Doherty power amplifier.

Figure 20:
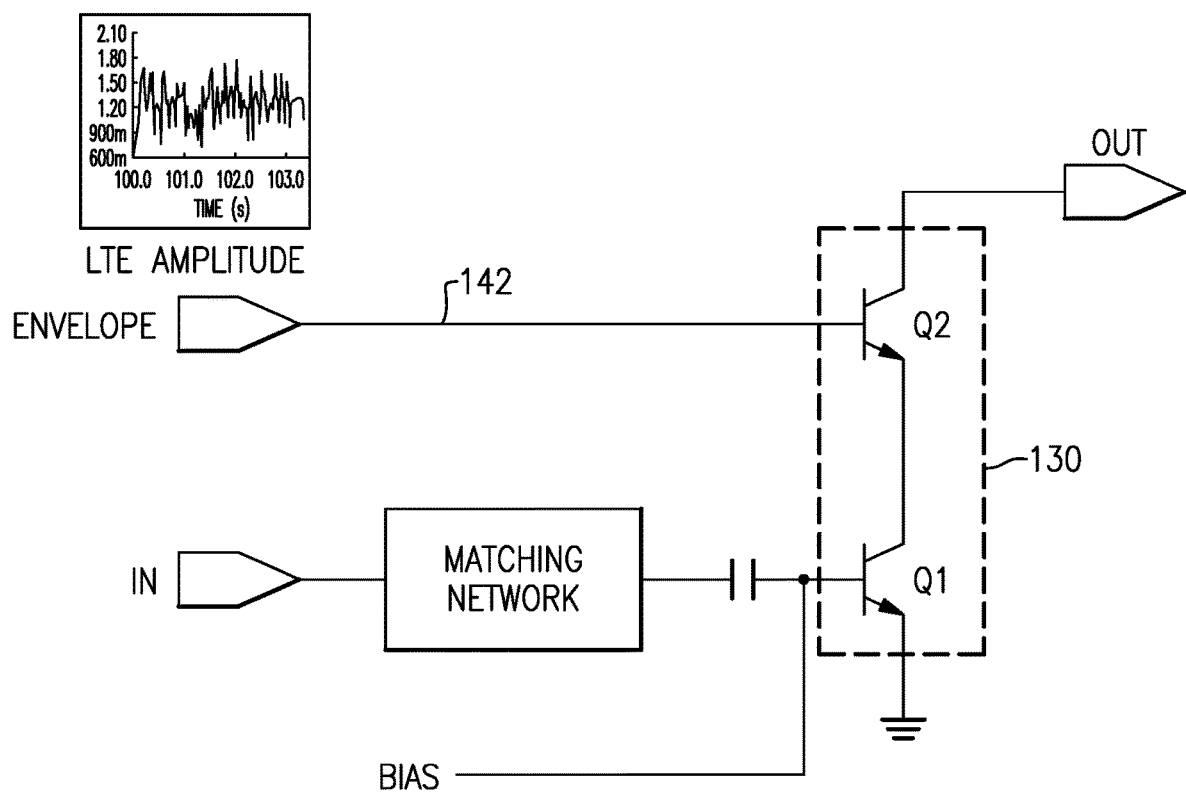
FIG. 20 shows a cascode-configured amplification stage by itself.

FIG. 20 shows a cascode-configured amplification stage 130 by itself. In the example context of BJTs, such an amplification stage can include a first transistor Q1 configured to receive an input signal (IN) through its base and output a partially amplified signal through its collector, with its emitter typically being grounded. The collector of Q1 is shown to be coupled to an emitter of a second transistor (also referred to as a cascode transistor); thus, the partially amplified signal from Q1 is received by Q2 through its emitter, and Q2 further amplifies and outputs the resulting amplified signal through its collector to an output node OUT.

In the example of FIG. 20, Q1 is shown to be biased with a bias signal (e.g., Class AB bias) through its base, and Q2 is shown to be biased with a bias signal that is based on an envelope control signal as described herein. Such an envelope control based bias signal is shown to be provided to the base of Q2 through an envelope control node (Envelope) and the path 142.

In some embodiments, the envelope control signal, and thus the corresponding bias signal for Q2, can be configured for amplification operations involving LTE cellular/data signals. It will be understood that one or more features of the present disclosure can also be implemented to support other wireless signals.

It will also be understood that one or more features of the present disclosure can also be implemented for a cascode-configured amplification stage having other types of amplifying transistors. For example, the foregoing description in reference to FIG. 20 can also apply to amplifying transistors implemented as field-effect transistors (FETs).

Figure 21:
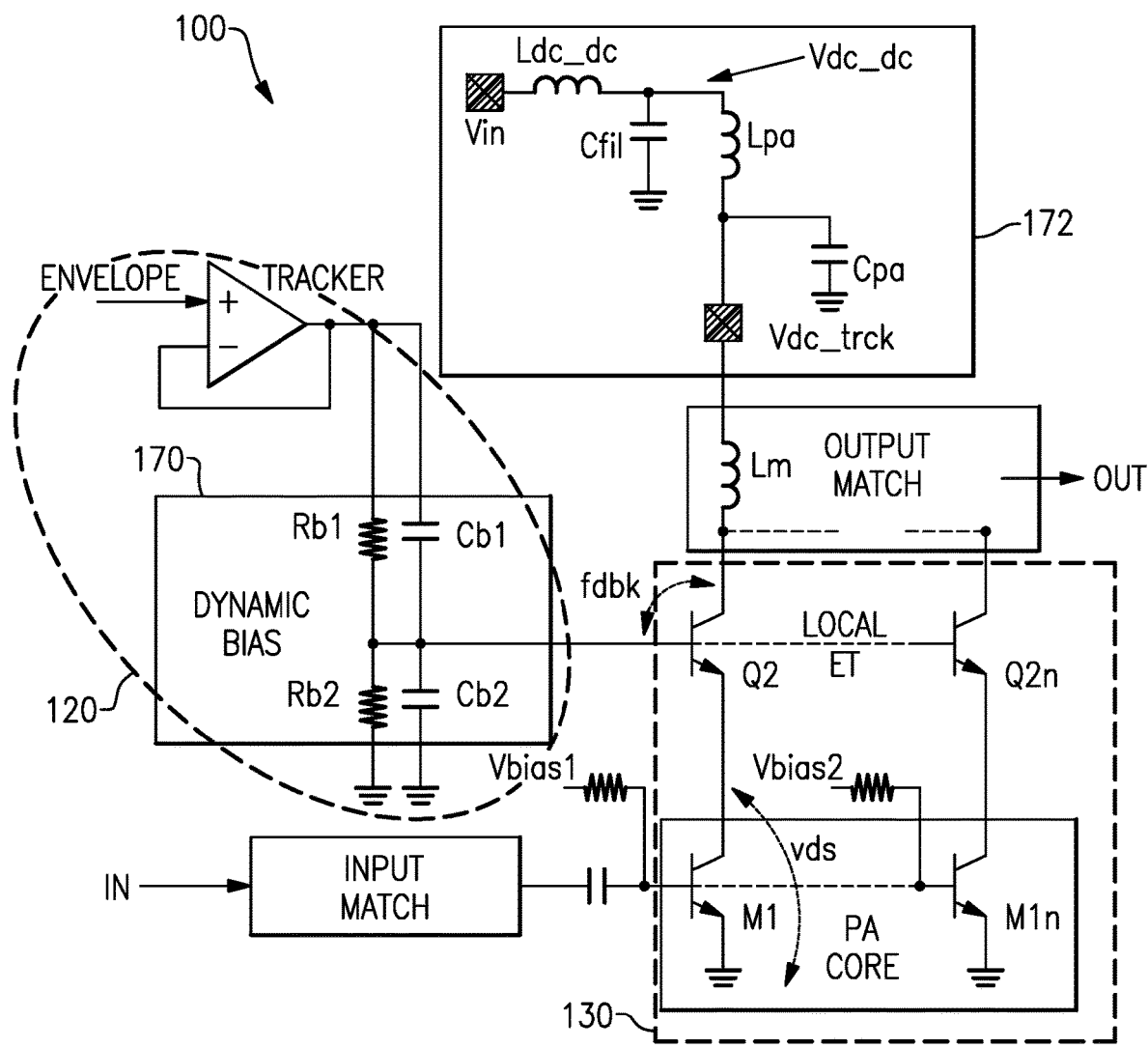
FIG. 21 shows that in some embodiments, a cascode-configured amplification stage of a power amplifier system can be configured such that an envelope control based signal is provided to the cascode transistor as a bias signal.

FIG. 21 shows that in some embodiments, a cascode-configured amplification stage of a power amplifier system 100 (e.g., a Doherty power amplifier system) having one or more features as described herein, including a configuration associated with a Doherty power amplifier, can be configured such that an envelope control based signal is provided to the cascode transistor (e.g., to the base of the cascode transistor) as a bias signal. In such an example configuration, a supply voltage to the cascode transistor (e.g., to the collector of the cascode transistor) can be provided by a separate source.

More particularly, in FIG. 21, one or more cascode circuits (n circuits, with n being a positive integer greater than or equal to 1) can be arranged in parallel to form a cascode-configured amplification stage 130. In such a configuration, the first transistor of each cascode circuit (e.g., common-emitter transistor M11, . . . , or M1n) is shown to receive an input signal through its base, distributed from the input (IN) and generate a partially amplified signal through its collector. The collector of each M1 is shown to be coupled to the emitter of the corresponding second transistor (cascode transistor, Q21, . . . , or Q2n), such that the partially amplified signal from M1 is provided to the emitter of the corresponding cascode transistor Q2, so as to generate a further amplified signal through Q2's collector. If there are more than one cascode circuits, the outputs of the collectors of the cascode transistors Q2s can be combined to provide an amplified signal at the output node (OUT).

In the example of FIG. 21, the base(s) of the M1 transistor(s) can be provided with a common bias signal, separate bias signals, or some combination thereof. Further, the base(s) of the Q2 transistor(s) can be provided with an envelope control based bias signal as described herein. In the Example of FIG. 21, such an envelope control based bias signal can be provided by an envelope tracking bias circuit 120 that includes an envelope tracker circuit and a dynamic bias circuit 170 implemented between the envelope tracker and the base(s) of the Q2 transistor(s). In the example shown, the dynamic bias circuit 170 can include a parallel combination of a resistance Rb1 and a capacitance Cb1 implemented between the output of the envelope tracker and the base(s) of the Q2 transistor(s). The dynamic bias circuit 170 can further include a parallel combination of resistance Rb2 and a capacitance Cb2 implemented between the base(s) of the Q2 transistor(s) and ground. In some embodiments, some or all of the resistances and capacitances can be configured to have fixed values, adjustable values, or any combination thereof.

In the example of FIG. 21, the envelope control based bias signal is shown to be provided to the base(s) of the Q2 transistor(s), but not to the collector(s). In the example of FIG. 21, the collector(s) of the Q2 transistor(s) is/are shown to be provided with a supply voltage through a supply circuit 172 implemented between an input voltage node Vin and a supply node Vdc_trck.

Figure 22:
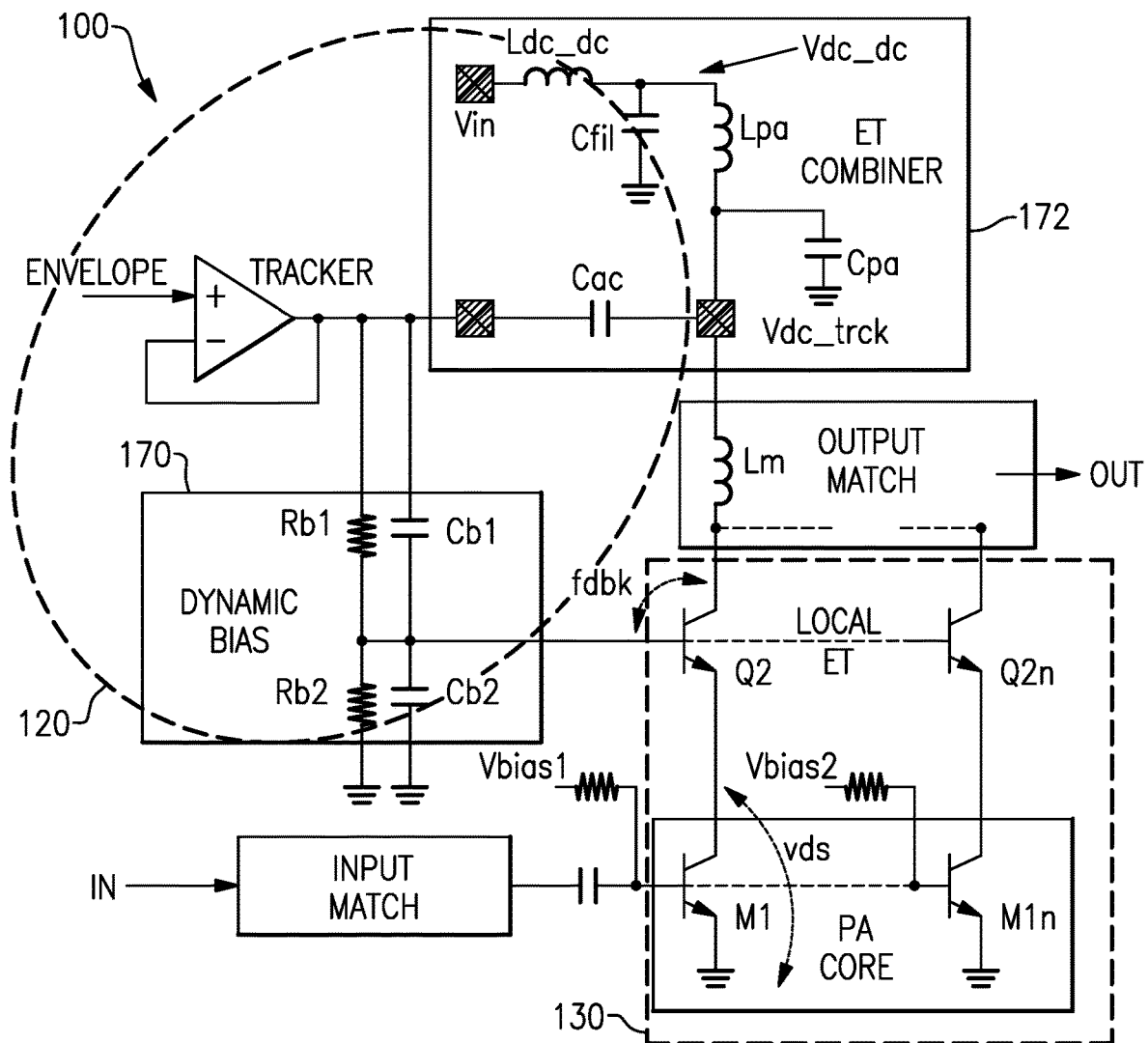
FIG. 22 shows a power amplifier system that is similar to the example of FIG. 21, but with its supply voltage to the collector(s) of the transistor(s) also being controlled by an envelope tracking circuit.

FIG. 22 shows a power amplifier system 100 that is similar to the example of FIG. 21, but with its supply voltage to the collector(s) of the Q2 transistor(s) also being controlled by an envelope tracking circuit 120. Thus, in the example of FIG. 22, the envelope tracking circuit 120 can be configured to provide the envelope control based bias signal to the base(s) of the Q2 transistor(s) similar to the example of FIG. 21. The envelope tracking circuit 120 can be further configured to modulate the supply voltage of the supply circuit 172 based on the output of the envelope tracker.

Various examples described herein in reference to FIGS. 1-22 generally relate to Doherty power amplifiers. FIGS.

Figure 23:
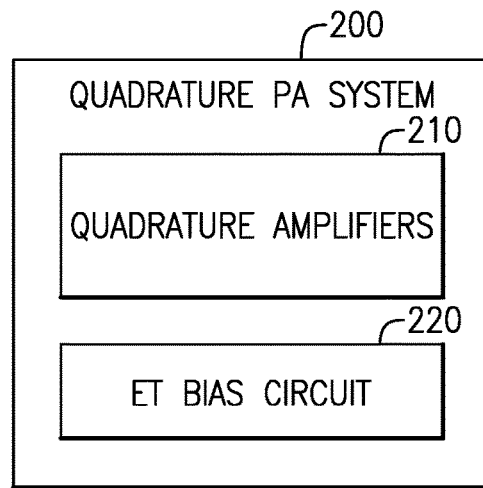
FIG. 23 depicts a block diagram of a quadrature power amplifier system that can include one or more features of the present disclosure.

23-29 show that in some embodiments, one or more features of the present disclosure can also be implemented in other types of power amplifier configurations. For example, FIG. 23 depicts a block diagram of a quadrature power amplifier system 200 that can include one or more features of the present disclosure. In some embodiments, such a quadrature power amplifier system 200 can include amplifiers configured and operated in quadrature (indicated as 210), and an envelope tracking bias circuit 220.

Figure 24:
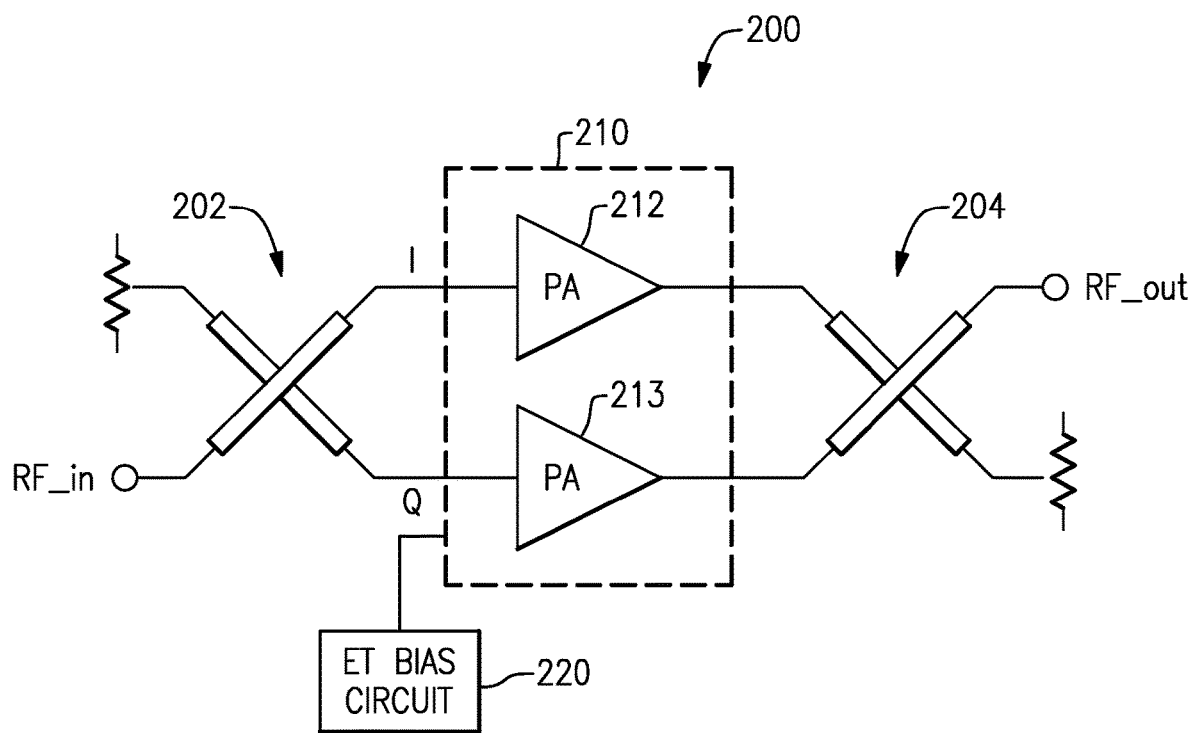
FIG. 24 depicts an assembly of amplifiers implemented so as to allow amplification of quadrature signals associated with an input signal to be amplified.

FIG. 24 depicts an assembly 210 of amplifiers 212, 213 (e.g., power amplifiers) implemented so as to allow amplification of quadrature signals (e.g., I and Q signals) associated with an input signal (RF_in) to be amplified. Such quadrature signals can be generated from the input signal by an input circuit 202, and the amplified quadrature signals from the amplifiers 212, 213 can be combined by a combiner circuit 204 to generate an output signal (RF_out).

FIG. 24 further shows that in some embodiments, at least some of the amplifiers 212, 213 can be provided with a bias signal that is based on an envelope control signal. In FIG. 24, such a bias signal can be provided by an envelope tracking bias circuit 220.

In some embodiments, the envelope tracking bias circuit 220 can be similar to the examples described herein in reference to the Doherty power amplifier system. In some embodiments, the envelope tracking bias circuit 220 can be different from the Doherty power amplifier based examples.

Figure 25:
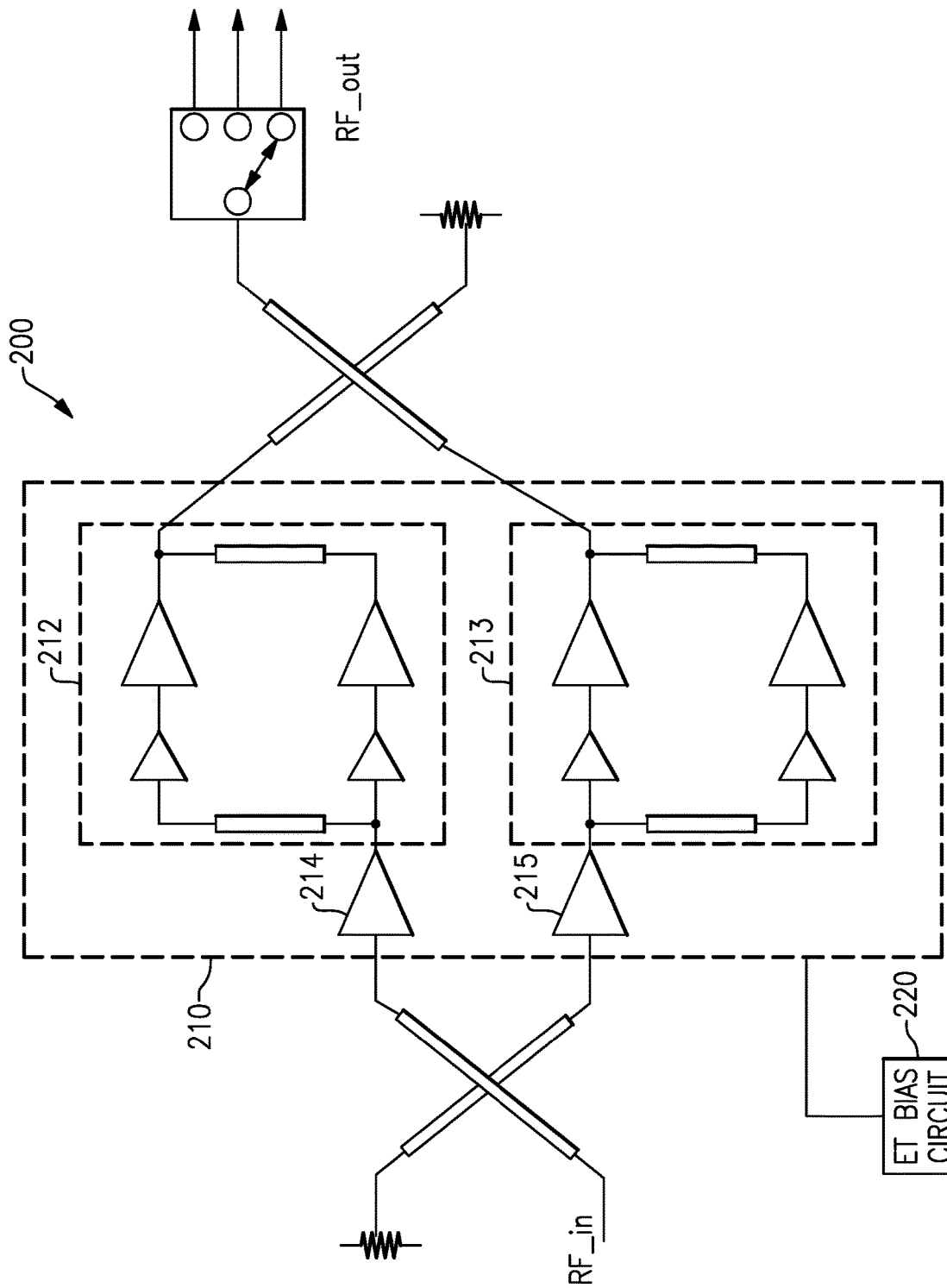
FIG. 25 shows that in some embodiments, each of the amplifiers of FIG. 24 can be implemented as a Doherty amplifier.

In some embodiments, each of the amplifiers 212, 213 can be implemented as a single ended amplifier with one or more amplification stages, or as a Doherty amplifier. For example, FIG. 25 shows a configuration where each of the amplifiers 212, 213 is implemented as a Doherty amplifier. Accordingly, the two Doherty amplifiers 212, 213 are parts of an assembly 210 of amplifiers configured to amplify quadrature signals.

In the example of FIG. 25, each of the two quadrature signal paths is shown to include a pre-amplifier (214 or 215). It will be understood that in some embodiments, such a pre-amplifier may or may not be included in the assembly of quadrature amplifiers 210.

In the example of FIG. 25, each of the carrier amplifier and the peaking amplifier of each of the two Doherty amplifiers 212, 213 is shown to include two stages, similar to the example of FIG. 9. It will be understood that in some embodiments, such a carrier amplifier and/or the peaking amplifier can include a single stage (e.g., a cascode-configured stage or otherwise), or more than two stages.

In the example of FIG. 25, the quadrature amplifier system 200 can further include an envelope tracking bias circuit 220 configured to provide a bias signal to at least some of the quadrature amplifier system 200 based on an envelope control signal. In some embodiments, such an envelope tracking bias circuit can be configured to be similar to the various examples described herein in reference to FIGS. 7-22.

FIGS. 26-29 show various examples of a quadrature amplifier system 200 having quadrature amplifiers 212, 213. Each of such quadrature amplifiers is shown to be implemented as a Doherty amplifier. More particularly, the first quadrature amplifier 212 is shown to include a carrier amplifier having a first stage and a second stage 220a, and a peaking amplifier having a first stage and a second stage 230a. Similarly, the second quadrature amplifier 213 is shown to include a carrier amplifier having a first stage and a second stage 220b, and a peaking amplifier having a first stage and a second stage 230b. In some embodiments, each of the second stages 220a, 230a, 220b, 230b of the first and second quadrature amplifiers 212, 213 can be implemented as a cascode-configured stage, similar to the example of FIG. 9.

In some embodiments, each peaking amplifier of the two quadrature amplifiers 212, 213 can be provided with and operate with a bias signal that is based on an envelope control signal. For example, in the context of the peaking amplifier having the cascode-configured stage (e.g., 130 in FIG. 9), the cascode transistor of such a stage can be provided with and operate with such a bias signal, similar to the example of FIG. 9.

Figure 26:
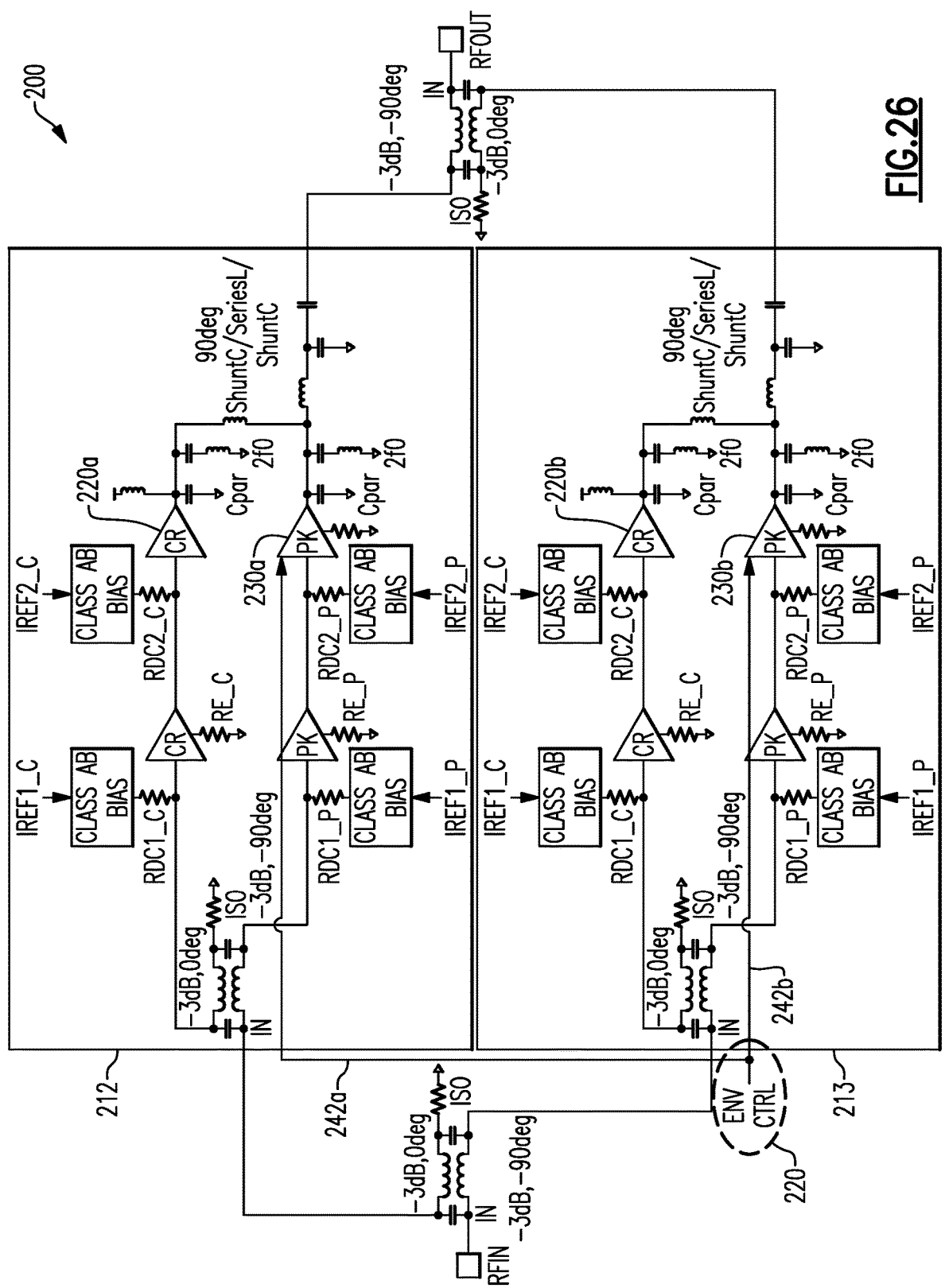
FIG. 26 shows that in some embodiments, the amplification stages of the peaking amplifiers of the first and second quadrature amplifiers can be provided with a common bias signal from a common envelope tracking bias circuit.

FIG. 26 shows that in some embodiments, the amplification stages 230a, 230b of the peaking amplifiers of the first and second quadrature amplifiers 212, 213 can be provided with a common bias signal from a common envelope tracking bias circuit 220. In FIG. 26, such an envelope tracking bias circuit is shown to provide a common envelope control signal to the amplification stage 230a through a path 242a, and to the amplification stage 230b through a path 242b.

Figure 27:
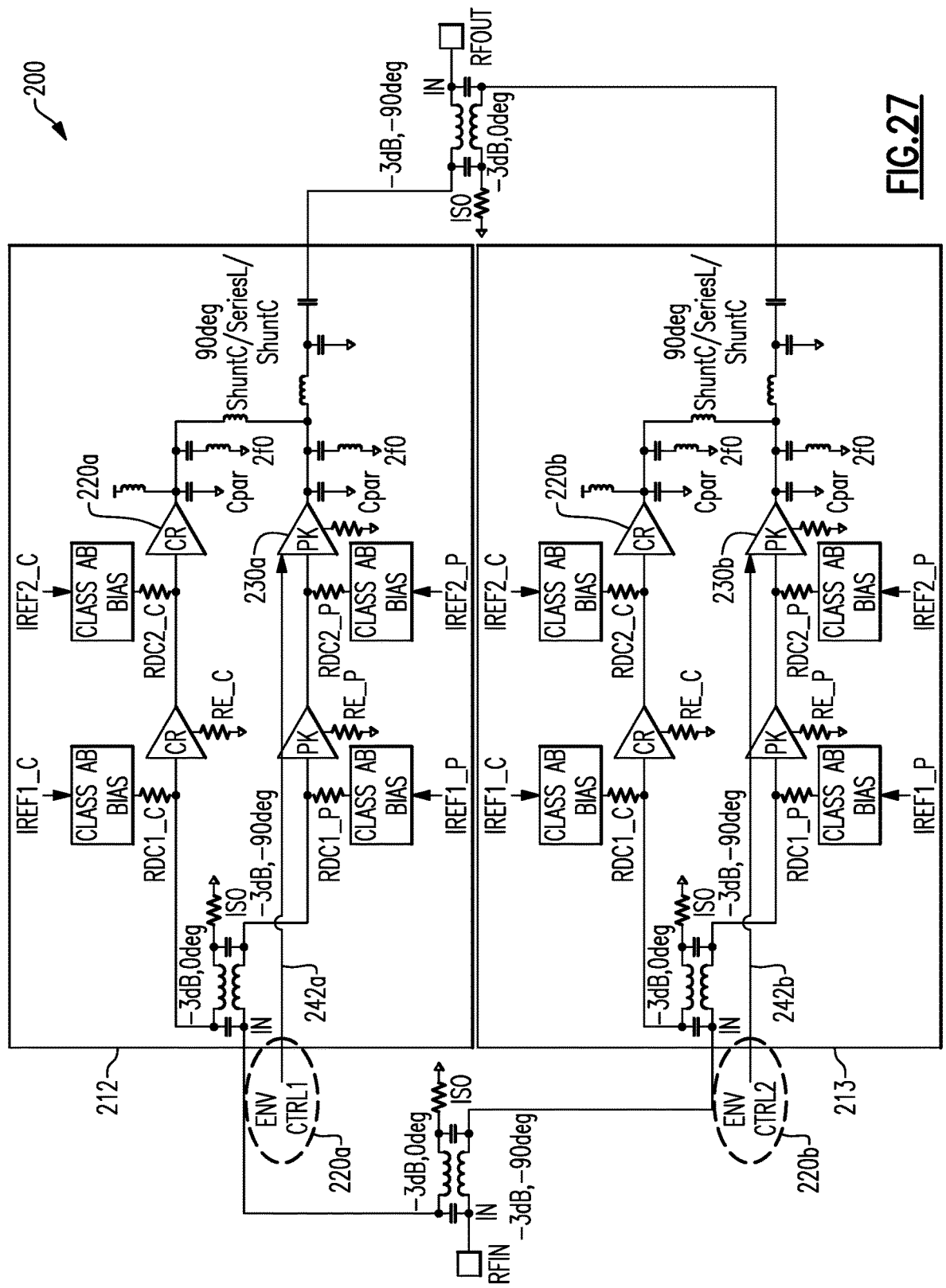
FIG. 27 shows a more generic configuration where an amplification stage of a peaking amplifier of a first quadrature amplifier is provided with a first bias signal, and an amplification stage of a peaking amplifier of a second quadrature amplifier is provided with a second bias signal, where the first and second bias signals may or may not be the same.

FIG. 27 shows a more generic configuration where the amplification stage 230a of the peaking amplifier of the first quadrature amplifier 212 is provided with a bias signal (through a path 242a) from an envelope tracking bias circuit 220a, and the amplification stage 230b of the peaking amplifier of the second quadrature amplifier 213 is provided with a bias signal (through a path 242b) from an envelope tracking bias circuit 220b. In FIG. 27, such bias signals may or may not be the same bias signal, and the envelope tracking bias circuits 220a, 220b may be parts of the same envelope tracking bias circuit, or may be different envelope tracking bias circuits.

In some embodiments, the envelope control based bias signals provided to the stages 230a, 230b can be different. For example, one bias signal can be adjusted in amplitude and/or be offset relative to the other bias signal to reduce mismatch and therefore improve performance.

Figure 28:
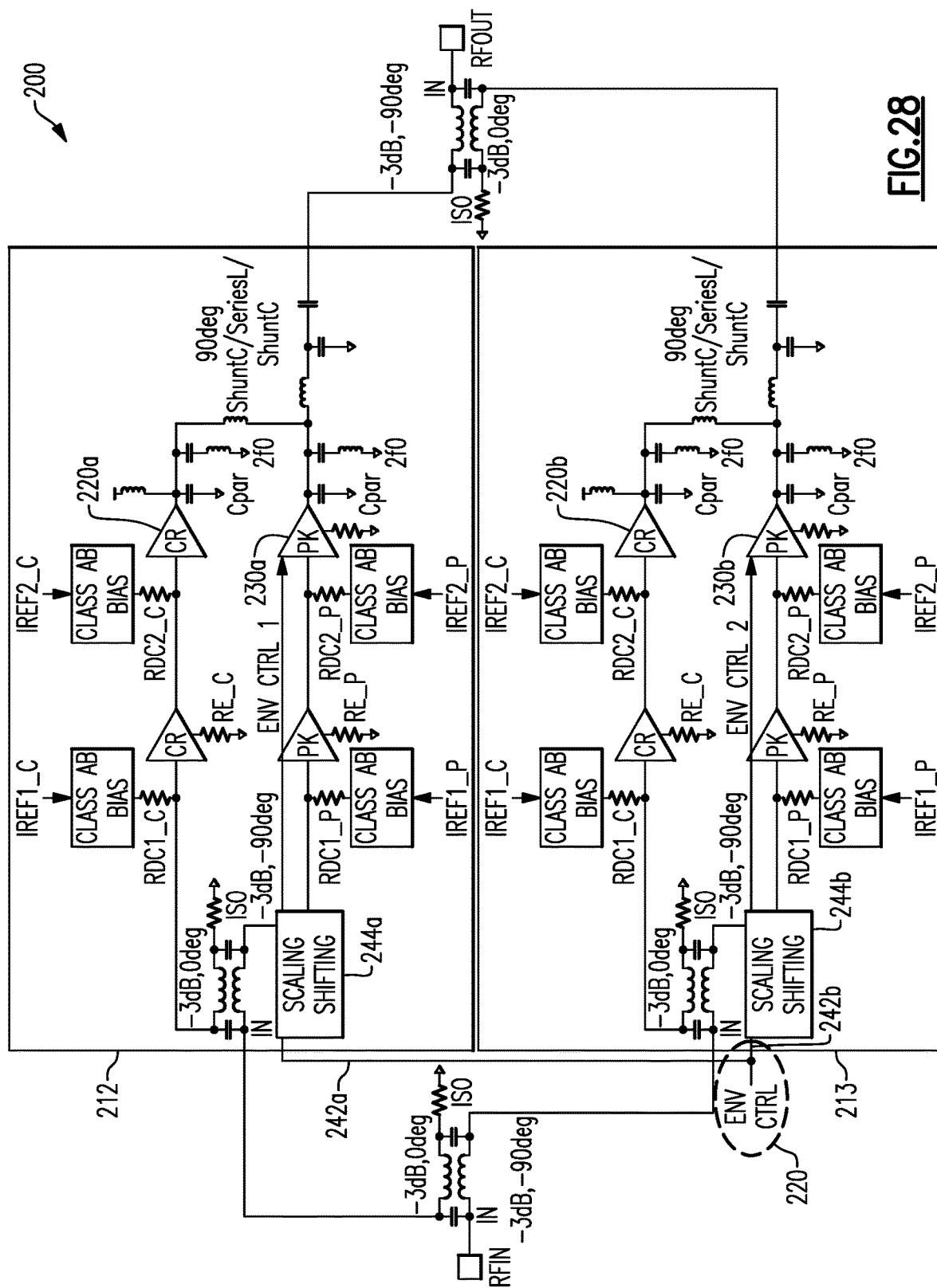
FIG. 28 shows an example configuration that is similar to the example of FIG. 26, but in which each of either or both of the bias signal paths can include a scaling/shifting circuit.

FIG. 28 shows an example configuration that is similar to the example of FIG. 26 (in the context of a common envelope tracking bias circuit 220), but in which each of either or both of the bias signal paths 242a, 242b can include a scaling/shifting circuit (244a or 244b). In such a configuration, a bias signal provided to the corresponding stage (230a or 230b) can be linearly derived from an envelope control signal (ENV CTRL) by shifting and rescaling. Accordingly, the resulting bias signals may be the same, or be different from each other. In some embodiments, linear coefficients can be programmed, derived from a mismatch measurement, or any combination thereof.

Figure 29:
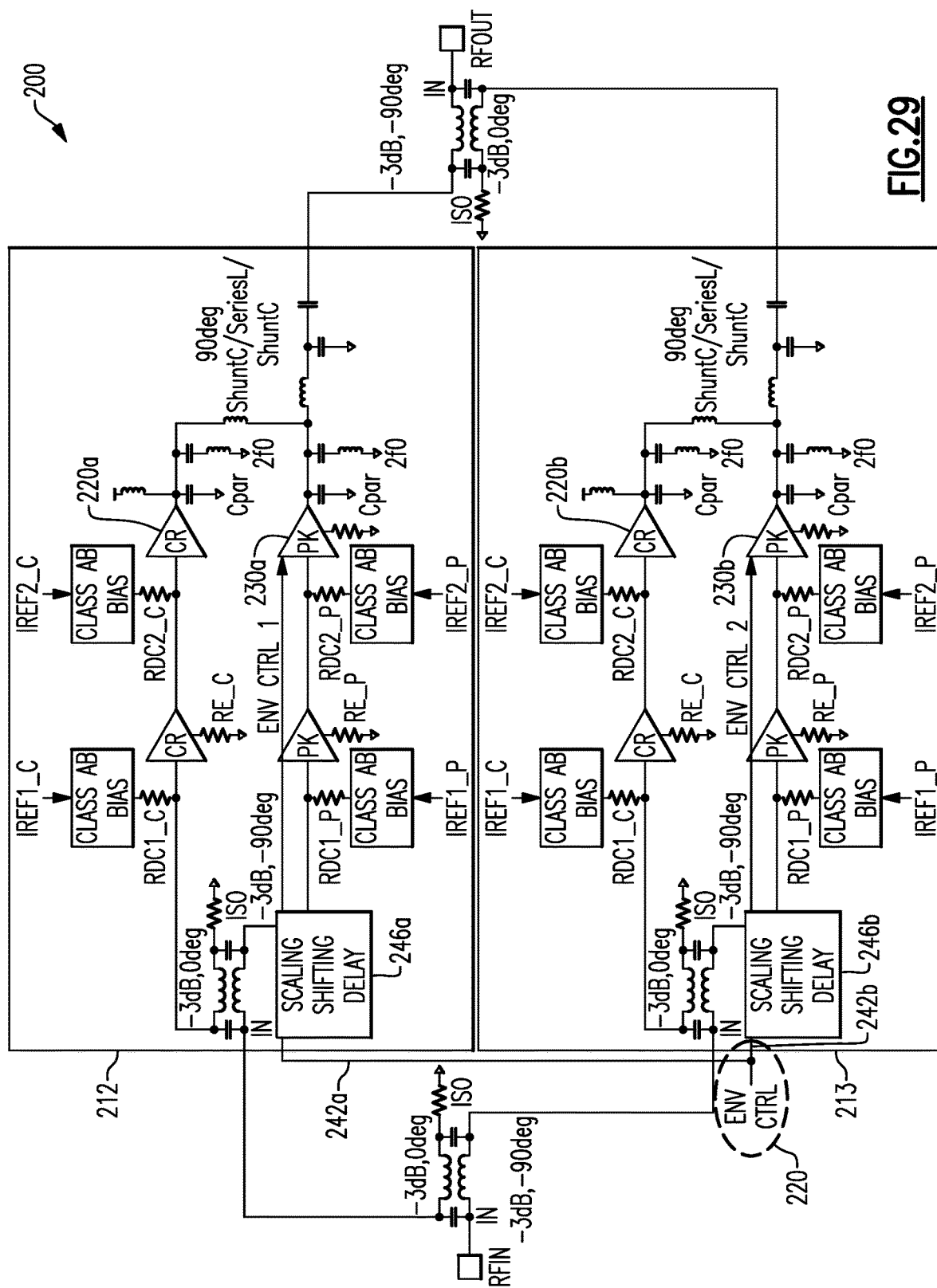
FIG. 29 shows an example configuration that is similar to the example of FIG. 26, but in which each of either or both of the bias signal paths can include a scaling/shifting/delay circuit.

FIG. 29 shows an example configuration that is similar to the example of FIG. 26 (in the context of a common envelope tracking bias circuit 220), but in which each of either or both of the bias signal paths 242a, 242b can include a scaling/shifting/delay circuit (246a or 246b). In such a configuration, a bias signal provided to the corresponding stage (230a or 230b) can be linearly derived from an envelope control signal (ENV CTRL) by shifting and rescaling similar to the example of FIG. 28, and can also include a delay. Accordingly, the resulting bias signals may be the same, or be different from each other. In some embodiments, various parameters associated with such adjustments can allow fine adjustments of timing on either or both branches 242a, 242b. Some or all of such parameters can be factory set, programmed based on center frequency or other known parameters of RF waveforms, etc.

Figure 30:
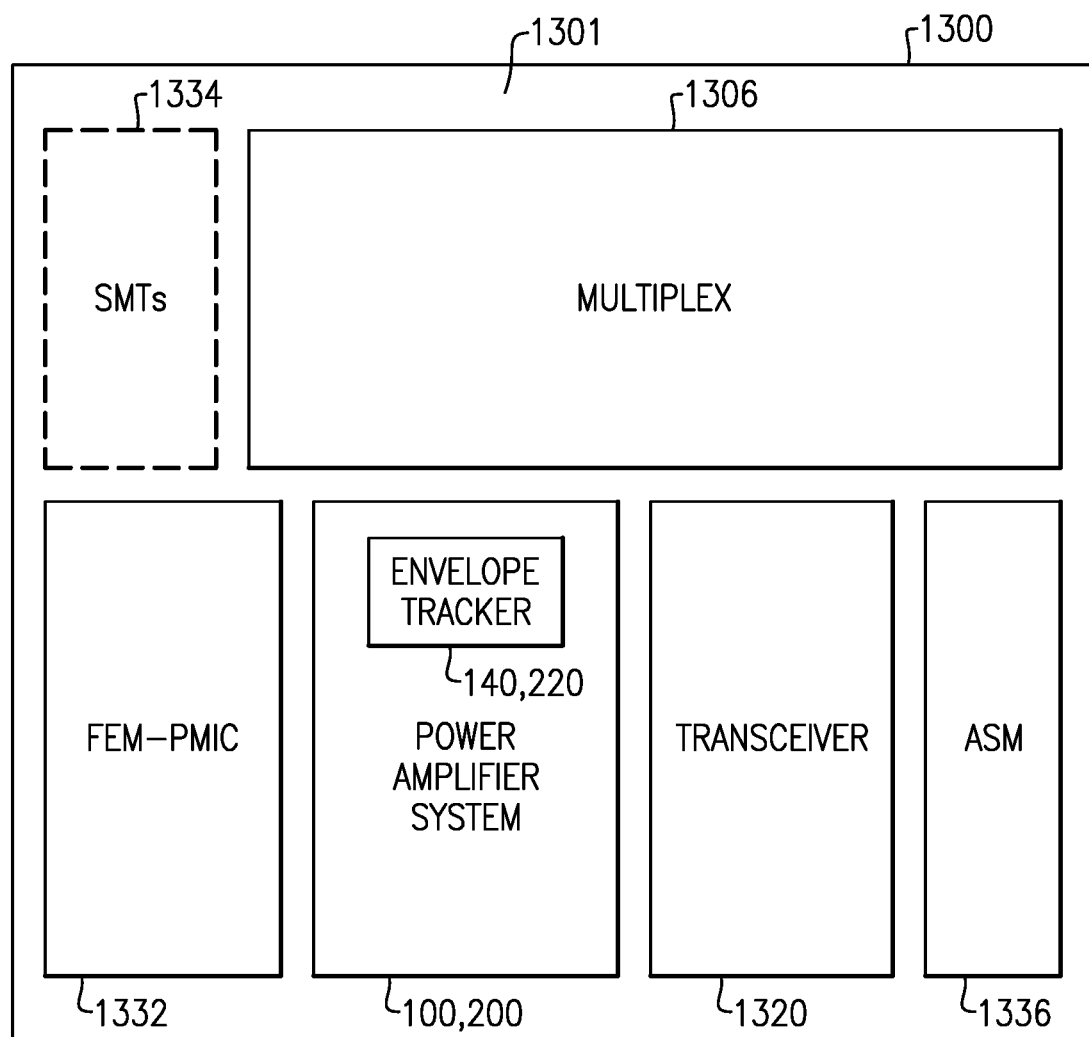
FIG. 30 shows that in some embodiments, some or all the wireless communications configurations disclosed herein can be implemented, wholly or partially, in a module.

FIG. 30 shows that in some embodiments, some or all the wireless communications configurations disclosed herein can be implemented, wholly or partially, in a module. In the example of FIG. 30, a module 1300 can include a packaging substrate 1301, and a number of components can be mounted on such a packaging substrate 1301. For example, a front end module power module integrated circuit (FEM-PMIC) component 1332, a power amplifier system (100 or 200) which includes an envelope tracker 1303, a transceiver 1320, and a multiplexer assembly 1306 can be mounted and/or implemented on and/or within the packaging substrate 1301. Other components such as a number of SMT devices 1334 and an antenna switch module (ASM) 1336 can also be mounted on the packaging substrate 1301. Although all of the various components are depicted as being laid out on the packaging substrate 1301, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 31:
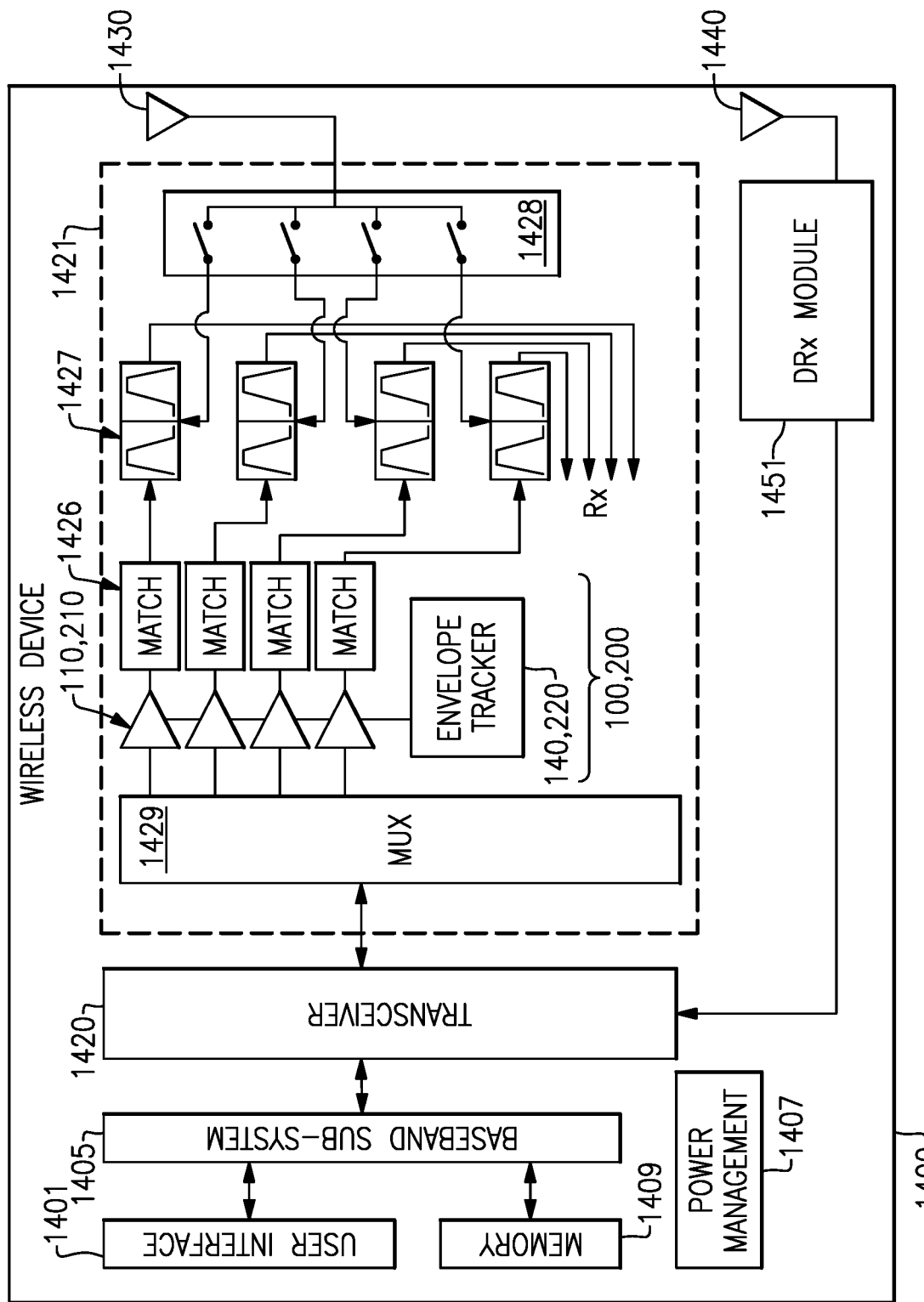
FIG. 31 illustrates an example wireless device having one or more advantageous features described herein.

FIG. 31 illustrates an example wireless device 1400 having one or more advantageous features described herein. In the context of a module having one or more features as described herein, such a module can be generally depicted by a dashed box 1421, and can be implemented as, for example, a front-end module (FEM) and a diversity receiver (DRx) module 1451 (which can be implemented within a diversity receiver system) coupled to a diversity antenna 1440 and a transceiver 1420.

The wireless device 1400 can include power amplifiers (PAs) (110 or 210) that receive their respective RF signals from the transceiver 1420 that can be configured and operated in known manners to generate RF signals to be amplified and transmitted, and to process received signals. Such power amplifiers, along with a respective envelope tracker (140 or 220) can be parts of a respective power amplifier system (100 or 200) as described herein. The transceiver 1420 is shown to interact with a baseband sub-system 1405 that is configured to provide conversion between data and/or voice signals suitable for a user and RF signals suitable for the transceiver 1420. The transceiver 1420 can also be in communication with a power management component 1407 that is configured to manage power for the operation of the wireless device 1400. Such power management can also control operations of the baseband sub-system 1405 and the modules 1421, 1451.

The baseband sub-system 1405 is shown to be connected to a user interface 1401 to facilitate various input and output of voice and/or data provided to and received from the user. The baseband sub-system 1405 can also be connected to a memory 1409 that is configured to store data and/or instructions to facilitate the operation of the wireless device, and/or to provide storage of information for the user.

In the example wireless device 1400, outputs of the PAs (110 or 210) are shown to be matched (via respective output match circuits 1426) and routed to their respective diplexers 1427. Such amplified and filtered signals can be routed to an antenna 1430 (or multiple antennas) through an antenna switch 1428 for transmission. In some embodiments, the diplexers 1427 can allow transmit and receive operations to be performed simultaneously using a common antenna (e.g., 1430). Received signals are shown to be routed to "Rx" paths (not shown) that can include, for example, a low-noise amplifier (LNA). In some implementations, the receive paths also include one or more filters (not shown). The front end module 1421 can include a multiplexer 1429 configured to direct signals from the transceiver 1429 to the PAs (110 or 210).

The wireless device 1400 includes an envelope tracker (140 or 210) configured to generate envelope tracking signals to bias and/or power the power amplifiers (110 or 210) as described herein.

The wireless device also includes a diversity antenna 1440 and a diversity receiver module 1451 that receives signals from the diversity antenna 1440. The diversity receiver module 1451 transmits received signals to the transceiver 1410. In some embodiments, a diplexer or triplexer can be included between the diversity antenna 1440 and the diversity receiver module 1451 and/or between the primary antenna 1430 and the front end module 1421.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Additional examples related to Doherty power amplifiers can be found in, for example, U.S. Pat. No. 9,806,681, titled DOHERTY POWER AMPLIFIER HAVING AM-AM COMPENSATION, which is expressly incorporated by reference in its entirely.

Additional examples related to envelope-based biasing of a power amplifier can be found in, for example, U.S. patent application Ser. No. 15/596,149, titled POWER AMPLIFICATION SYSTEM WITH ENVELOPE-BASED BIAS, which is expressly incorporated by reference in its entirely.

Additional examples related to envelope tracking of power amplifiers can be found in, for example, U.S. patent application Ser. No. 15/811,394, titled ENVELOPE TRACKING FOR HIGH POWER AMPLIFIERS, which is expressly incorporated by reference in its entirely.

Additional examples related to power amplification system with pre-amplifier (e.g., 214 and 215 in FIG. 25 of the present disclosure) can be found in, for example, U.S. Publication No. 2016/0241295, titled POWER AMPLIFICATION SYSTEM WITH COMMON BASE PRE-AMPLIFIER, which is expressly incorporated by reference in its entirely.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An amplifier system comprising:
a Doherty amplifier including a carrier amplifier and a peaking amplifier, each of the carrier amplifier and the peaking amplifier including a cascode stage with input and output transistors arranged in a cascode configuration;
an envelope tracking bias circuit coupled to the Doherty amplifier and configured to provide a bias signal to the output transistor of the cascode stage of the peaking amplifier; and
a supply circuit configured to provide a non-envelope tracking supply voltage to the output transistor of the cascode stage of the peaking amplifier.

2. The amplifier system of claim 1 wherein the Doherty amplifier is a power amplifier.

3. The amplifier system of claim 1 wherein the envelope tracking bias circuit is configured to provide a bias signal only to the peaking amplifier among the carrier and peaking amplifiers.

4. The amplifier system of claim 1 wherein the envelope tracking bias circuit is configured to provide a bias signal only to the output transistor of the cascode stage among the transistors of the peaking amplifier.

5. The amplifier system of claim 1 wherein each of the input and output transistors of the carrier amplifier and the peaking amplifier is implemented as a bipolar-junction transistor having a base, an emitter, and a collector.

6. The amplifier system of claim 5 wherein the input transistor of the cascode stage is implemented in a common-emitter configuration such that an input signal is received by its base, and its collector is coupled to the emitter of the output transistor of the cascode stage.

7. The amplifier system of claim 6 wherein the output transistor of the cascode stage is implemented in a common-base configuration such that an output signal is provided through its collector, and the bias signal from the envelope tracking bias circuit is provided to its base.

8. The amplifier system of claim 1 wherein each of the input and output transistors of the carrier amplifier and the peaking amplifier is implemented as a field-effect transistor having a gate, a source, and a drain.

9. The amplifier system of claim 8 wherein the input transistor of the cascode stage is implemented in a common-source configuration such that an input signal is received by its gate, and its drain is coupled to the source of the output transistor of the cascode stage.

10. The amplifier system of claim 9 wherein the output transistor of the cascode stage is implemented in a common-gate configuration such that an output signal is provided through its drain, and the bias signal from the envelope tracking bias circuit is provided to its gate.

11. The amplifier system of claim 1 wherein each of the carrier amplifier and the peaking amplifier further includes a driver stage implemented before the respective cascode stage.

12. The amplifier system of claim 11 wherein the driver stage of each of the carrier amplifier and the peaking amplifier is configured to operate with a Class AB bias.

13. The amplifier system of claim 11 wherein the input transistor of the cascode stage of each of the carrier amplifier and the peaking amplifier is configured to operate with a Class AB bias.

14. The amplifier system of claim 13 wherein the output transistor of the cascode stage of the carrier amplifier is configured to operate with a substantially constant bias voltage.

15. The amplifier system of claim 1 wherein the Doherty amplifier presents a load current that is less than 10 mA to the envelope tracking bias circuit.

16. The amplifier system of claim 15 wherein the Doherty amplifier presents a load current that is less than 5 mA to the envelope tracking bias circuit.

17. The amplifier system of claim 16 wherein the load current of the Doherty amplifier presented to the envelope tracking bias circuit is less than $\frac{1}{100}$ of a load current presented to a similar envelope tracking circuit that provides an envelope tracking supply voltage.

18. The amplifier system of claim 1 wherein the Doherty amplifier presents a load capacitance that is less than 100 pF to the envelope tracking bias circuit.

19. A Doherty amplifier comprising:
a carrier amplifier having a cascode stage with input and output transistors arranged in a cascode configuration; and
a peaking amplifier having a cascode stage with input and output transistors arranged in a cascode configuration, the output transistor of the cascode stage of the peaking amplifier configured to receive and operate with a bias signal that is based on an envelope control signal, the output transistor of the cascode stage of the peaking amplifier further configured to receive and operate with a non-envelope tracking supply voltage.

20. A power amplifier module comprising:
a packaging substrate configured to receive a plurality of components; and
a power amplifier system implemented on the packaging substrate, and including a Doherty amplifier having a carrier amplifier and a peaking amplifier, each of the carrier amplifier and the peaking amplifier including a cascode stage with input and output transistors arranged in a cascode configuration, the power amplifier system further including an envelope tracking bias circuit coupled to the Doherty amplifier and configured to provide a bias signal to the output transistor of the cascode stage of the peaking amplifier, the power amplifier system further including a supply circuit configured to provide a non-envelope tracking supply voltage to the output transistor of the cascode stage of the peaking amplifier.

* * * * *